(12) United States Patent
Yamazaki

(10) Patent No.: US 7,384,862 B2
(45) Date of Patent: Jun. 10, 2008

(54) METHOD FOR FABRICATING SEMICONDUCTOR DEVICE AND DISPLAY DEVICE

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 26 days.

(21) Appl. No.: 10/878,498

(22) Filed: Jun. 29, 2004

(65) Prior Publication Data

US 2005/0026423 A1    Feb. 3, 2005

(30) Foreign Application Priority Data

Jun. 30, 2003   (JP)   ............... 2003-186144

(51) Int. Cl.
  *H01L 21/44* (2006.01)
(52) U.S. Cl. ............... 438/610; 257/E23.166; 438/675; 438/760; 427/98.3
(58) Field of Classification Search ........... 438/610, 438/120, 637, 672, 674, 675, 679, 760, 778, 438/782; 257/506, 621, 632, 701, 702, E21.023, 257/E21.033; 427/96.1, 96.9, 97.7, 97.8, 427/97.9, 98.3, 99.3, 99.5, 292, 600, 601
  See application file for complete search history.

(56) References Cited

U.S. PATENT DOCUMENTS

| | | | |
|---|---|---|---|
| 5,148,259 A | 9/1992 | Kato et al. | |
| 5,250,465 A | 10/1993 | Iizuka et al. | |
| 5,536,950 A | 7/1996 | Liu et al. | |
| 5,644,370 A | 7/1997 | Miyawaki et al. | |
| 5,706,064 A | 1/1998 | Fukunaga et al. | |
| 5,948,705 A | 9/1999 | Jun | |
| 5,953,629 A | 9/1999 | Imazeki et al. | |
| 5,976,393 A | 11/1999 | Abe | |
| 6,043,149 A | 3/2000 | Jun | |
| 6,057,234 A | 5/2000 | Yamazaki | |
| 6,081,305 A | 6/2000 | Sato et al. | |
| 6,097,453 A | 8/2000 | Okita | |
| 6,171,961 B1 | 1/2001 | Yamazaki et al. | |
| 6,221,140 B1 | 4/2001 | Kobayashi et al. | |
| 6,225,218 B1 | 5/2001 | Yamazaki et al. | |
| 6,436,827 B1 | 8/2002 | Yamazaki et al. | |

(Continued)

FOREIGN PATENT DOCUMENTS

JP    06-97294    4/1994

(Continued)

*Primary Examiner*—Carl Whitehead, Jr.
*Assistant Examiner*—Colleen E Rodgers
(74) *Attorney, Agent, or Firm*—Nixon Peabody LLP; Jeffrey L. Costellia

(57) ABSTRACT

It is an object of the present invention to alleviate unevenness due to an opening for making a contact with the lower layer even when the opening has a large diameter (1 μm or more). Thus, it is a further object of the invention to reduce defects caused by the unevenness due to the contact hole. It is a feature of the invention to form a wiring by filling the contact hole with conductive fine particles. The conductive fine particles can be easily dispersed into a wiring material by using conductive fine particles having high wettability with the wiring material, thereby making a contact. Thus, planarization of a contact hole can be achieved without performing a reflow process. Further, more planarity can be obtained by performing a reflow process in addition, and the reliability is improved accordingly.

34 Claims, 17 Drawing Sheets

U.S. PATENT DOCUMENTS

| | | |
|---|---|---|
| 6,661,096 B1 | 12/2003 | Takayama et al. |
| 6,790,281 B2 | 9/2004 | Doi et al. |
| 7,245,018 B1 | 7/2007 | Takayama et al. |
| 2001/0011727 A1 | 8/2001 | Yamazaki et al. |
| 2002/0000613 A1 | 1/2002 | Ohtani et al. |
| 2002/0197866 A1 | 12/2002 | Yamazaki et al. |
| 2003/0080436 A1 | 5/2003 | Ishikawa |
| 2003/0157272 A1* | 8/2003 | Tonai et al. ............... 427/600 |
| 2004/0241980 A1 | 12/2004 | Yamazaki et al. |
| 2005/0026410 A1 | 2/2005 | Yamazaki et al. |

FOREIGN PATENT DOCUMENTS

| | | |
|---|---|---|
| JP | 07-37979 | 2/1995 |
| JP | 09-134891 | 5/1997 |
| JP | 2002-059047 | 2/2002 |

* cited by examiner heat treatment

Heat Treatment

Heat Treatment
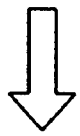

heat treatment heat treatment

Wiring Formation

Heat Treatment 1705
1706
1704
1702
1701
1703 heat treatment

1707

SiN

METHOD FOR FABRICATING SEMICONDUCTOR DEVICE AND DISPLAY DEVICE

BACKGROUND OF THE INVENTION

1. Field of the Invention

The present invention relates to a method for fabricating a semiconductor device. More specifically, the invention relates to a method for forming a contact between wirings of a semiconductor device.

2. Description of the Related Art

In recent years, in accordance with the development of technology, miniaturization and performance of electronic devices has been advanced, and the highly developed electronic devices are everywhere. In order to maintain a company's competitive edge, it has become very important not only to produce better products than other companies, but also to offer such products at lower prices.

How to produce advanced electronic devices without increasing the cost becomes key; however, if reliability and quality are sacrificed, it is impossible to satisfy users' needs. Higher production yields is a very effective measure to achieve further price reduction without degrading performance, reliability, and quality.

Most of electronic devices used today are equipped with devices using semiconductor elements. Defects in the devices using semiconductor elements are some of the factors to cause lower yield. Defects due to disconnection and high resistivity of a wiring, and display defects and defects due to display unevenness in display devices can be given as defects in such semiconductor devices.

When forming a conductive film used for a wiring, disconnection and high resistivity of the wiring is occasionally caused by poor coverage of the conductive film. The poor coverage mostly occurs around an opening where the conductive film makes a contact with the lower layer. Further, the poor coverage can occur, for example, when the contact is not made since the opening is not covered with a wiring material, or when a part of a wiring becomes too thin.

Display defects and unevenness are often due to unevenness caused reflecting the shape of the opening for forming a contact with the lower layer or the shape of the conductive film in the lower layer. When the unevenness leads to nonuniformly of the electrical field, display unevenness are caused in a liquid crystal display device. Meanwhile in an EL device, display defects such as dark spots and bright spots would be caused as well as display unevenness.

As to an IC, a CPU, or the like, higher precision, higher integration, and multilevel interconnection have been achieved. However, depressions or projections in layers are overlapped with each other in repeating layering; so that a large step height would be formed (FIG. 2A). Such a step may cause further reduction in yield.

In order to reduce such defects and steps of an opening for forming a contact with the lower layer, a measure as disclosed in Reference 1 is taken, for example (Reference 1: Japanese Patent Laid-Open No. 7-37979).

There is no problem if the diameter of a contact hole is small; however, when the diameter of a contact hole 102 is large as shown in FIGS. 3A to 3C, there has been a problem that the depression could not be filled completely, and a step 105 would remain although reflow is performed.

Further, as shown in FIGS. 4A to 4C, the thickness of a wiring around the contact hole 102 becomes too thin and the thin portion 106 may have high resistance. Still further, when the wettability of a material of the wiring 104 with a base insulating film 101 is low, disconnection may occur in the worst case.

In order to prevent such high resistance and disconnection, an approach to increase the thickness of the wiring 104 can be conceived; however, excessive thickness is undesirable in view of integration. Accordingly, even a countermeasure such as etchback as in Reference 1 is taken, the accuracy of the etchback would cause a problem.

BRIEF SUMMARY OF THE INVENTION

In view of the above problems, it is an object of the present invention to alleviate unevenness due to the contact hole 102 for forming a contact with the conductive film 100 in the lower layer even when the contact hole 102 has a large diameter (1 μm or more). Thus, it is a further object of the invention to reduce defects caused by the unevenness due to the contact hole 102.

It is a feature of the invention to form a wiring after a contact hole is filled with conductive fine particles. The conductive fine particles can be easily dispersed into a wiring material by using conductive fine particles having high wettability with the wiring material, thereby making a contact. Thus, planarization of a contact hole can be achieved without performing a reflow process. When the reflow process is not performed, reliability of around a contact hole can be improved in relatively advantageous condition to energy cost. Further, in the invention, a depression reflecting the shape of the contact hole may be filled with the conductive fine particles 103 after forming a wiring.

In the case where a reflow process is performed, the conductive fine particles may use a material which dissolves at lower temperatures, or a material which is alloyed with the wiring material at lower temperatures. Thus, a contact hole can easily be planarized by a reflow process at lower temperatures. In this case, connection with higher reliability can be obtained since the wiring material and the conductive fine particles are combined or alloyed.

The planarization is enabled, and a large step height can be inhibited by applying the invention. Thus, the invention can significantly contribute to improvements in yield and reliability of a semiconductor device, or the like.

A wiring is formed after a contact hole is filled with conductive fine particles, and the conductive fine particles use a material having high wettability with the wiring material. Thus, planarization of a contact hole can be achieved without performing a reflow process. When the reflow process is not performed, reliability of around a contact hole can be improved in relatively advantageous condition to energy cost.

In the case where a reflow process is performed, the conductive fine particles may use a material which dissolves at lower temperatures, or a material which is alloyed with the wiring material at lower temperatures. Thus, a contact hole can easily be planarized by a reflow process at lower temperatures. In this case, connection with higher reliability can be obtained since the wiring material and the conductive fine particles are combined or alloyed.

DETAILED DESCRIPTION OF THE INVENTION

Embodiment modes of the invention will be described below with reference to the drawings. Note that the invention is not limited to the following description, and those skilled in the art can easily understand that the modes and details can be variously changed without departing from the spirit and scope of the invention. Accordingly, the invention is not to be interpreted with limitation to the content of the following embodiments and embodiment modes.

Embodiment Mode 1

An embodiment mode of the invention will be described with reference to FIGS. 1A to 2B.

In FIGS. 1A to 1D, a contact hole 102 is formed in an insulating film 101 (FIG. 1A), and the wiring 104 is formed over the insulating film 101 over a conductive layer 100 on a surface. Thus, the wiring 104 is connected to the conductive layer 100 through the contact hole 102.

Figure 1A:
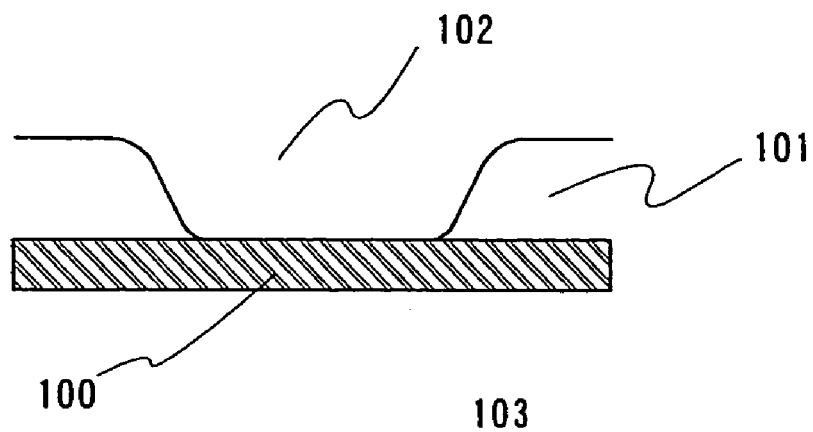
FIGS. 1A to 1D are figures in which planarity of a wiring is improved by filling a contact hole having a large diameter with conductive fine particles.
Figure 1B:
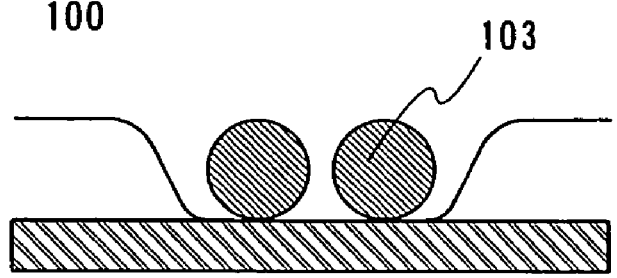

Next, a contact hole 102 is filled with conductive fine particles 103 (FIG. 1B). Material which has high wettability with a material of a wiring 104 may be used for the conductive fine particles 103.

Figure 1C:
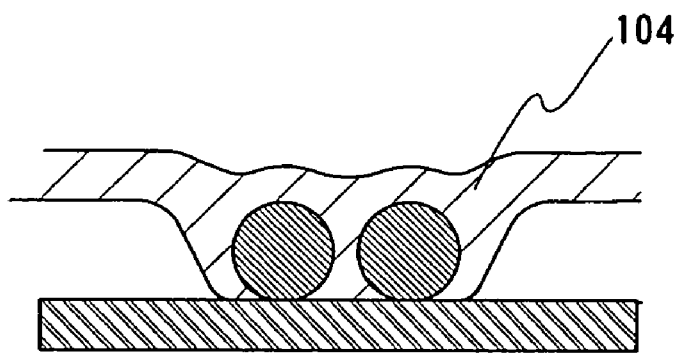

Next, a wiring 104 is formed so as to cover at least the conductive fine particles 103 and a part of the contact hole 102 (FIG. 1C). Since the conductive fine particles 103 uses material having high wettability with a material of the wiring 104, the conductive fine particles 103 can be easily dispersed in the wiring material, and a contact can be made. Thus, planarization of the contact hole can be realized without performing a reflow process. Reliability of around the contact hole can be improved in relatively advantageous condition to energy cost since a reflow process is not performed in this case. Further, according to the invention, a depression reflecting the shape of the contact hole may be filled with the conductive fine particles 103 after forming a wiring.

Figure 1D:
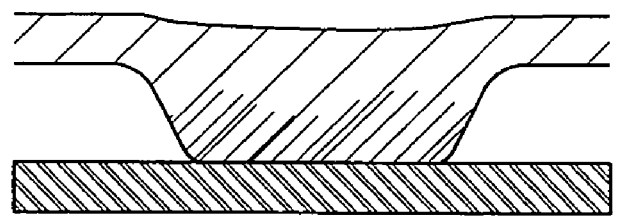

Further, in the case where a reflow process is performed, the conductive fine particles 103 may use material which dissolves at lower temperatures, or material which is alloyed with the wiring material at lower temperatures. Accordingly, a contact hole can easily be planarized by subsequently performing heat treatment at lower temperatures (FIG. 1D). Thus, connection with higher reliability can be obtained since the wiring material and the conductive fine particles 103 are combined or alloyed.

Figure 2A:
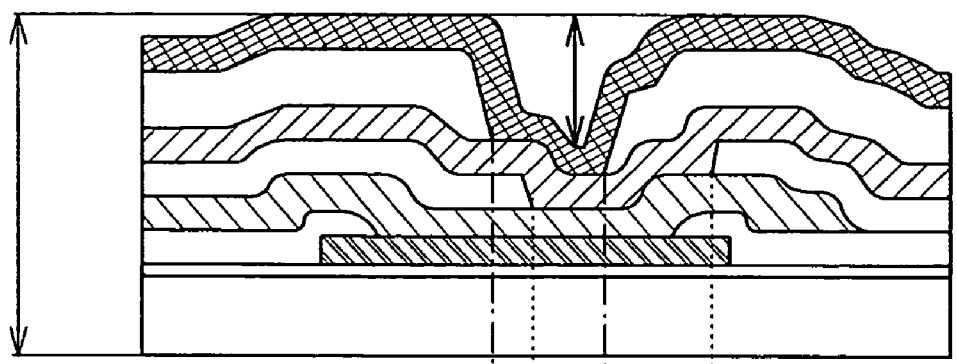
FIGS. 2A and 2B are figures which show a conventional embodiment.
Figure 2B:
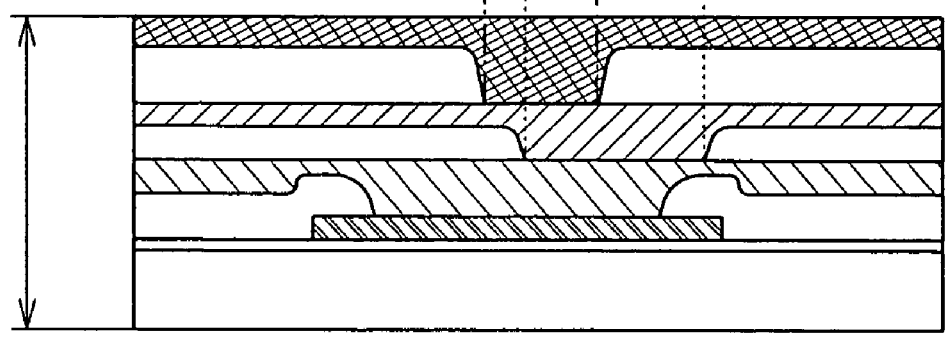
Figure 3A:
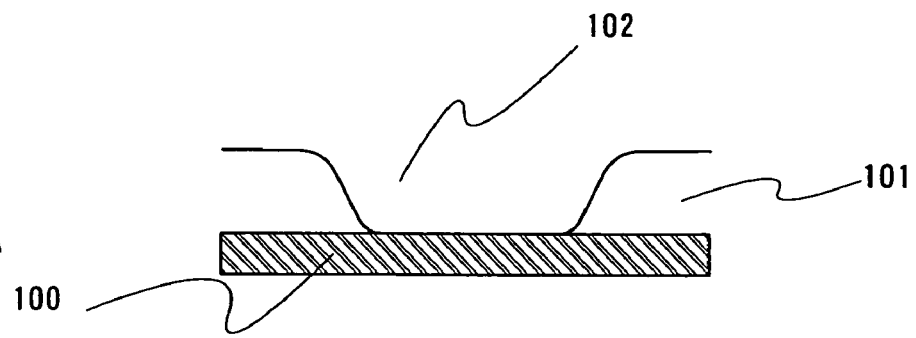
FIGS. 3A to 3C are figures which show a conventional embodiment.
Figure 3B:
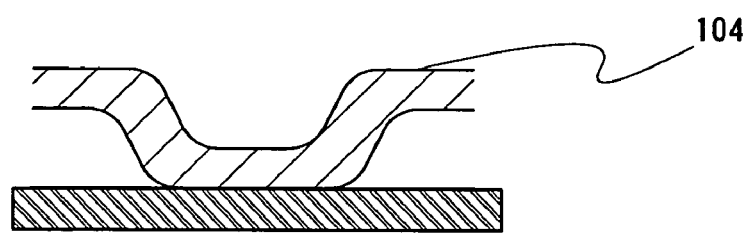
Figure 3C:
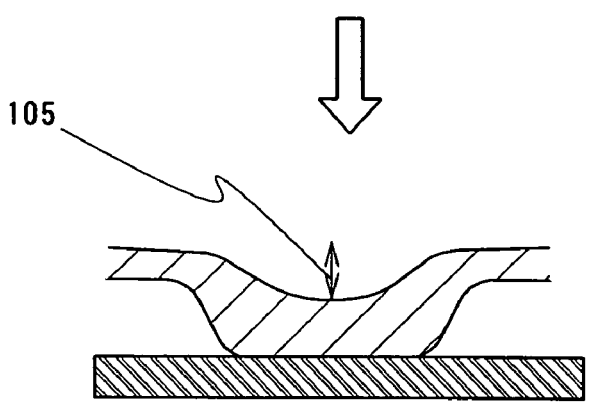
Figure 4A:
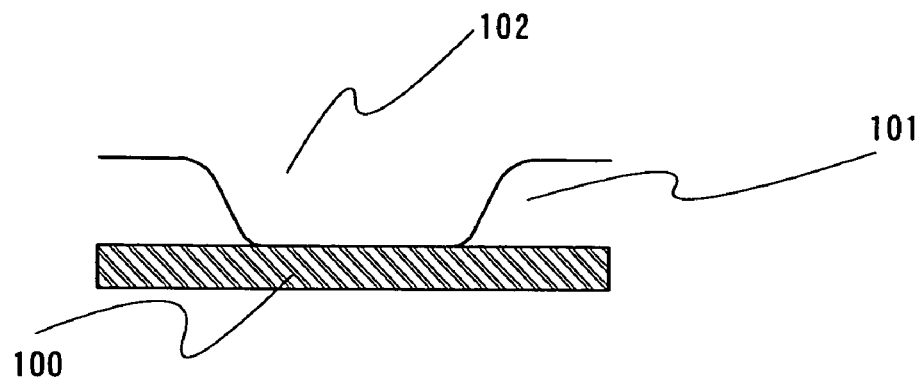
FIGS. 4A to 4C are figures which show a conventional embodiment.
Figure 4B:
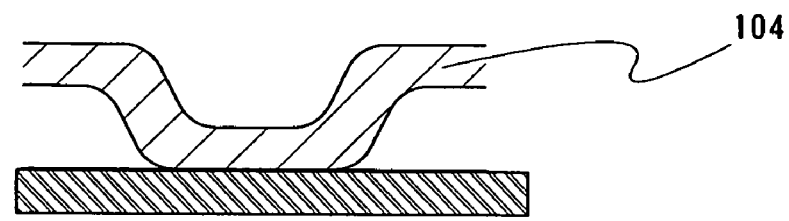
Figure 4C:
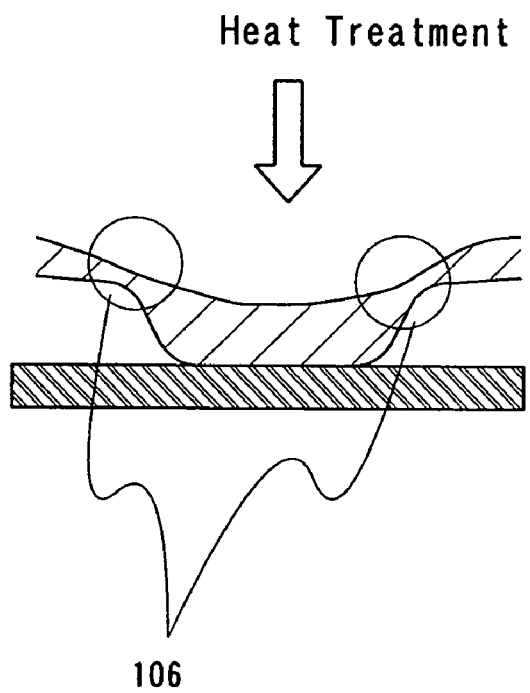
Figure 5A:
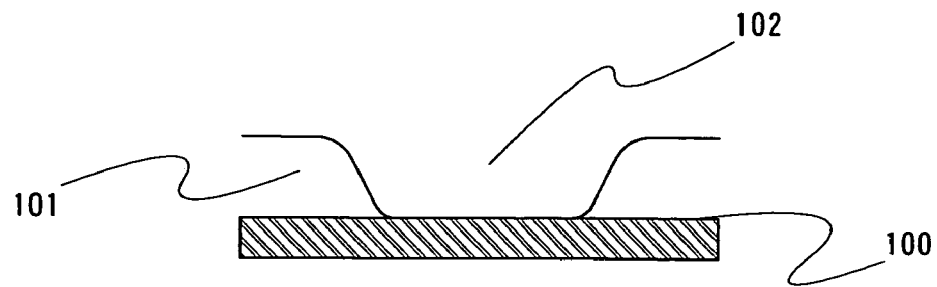
FIGS. 5A to 5D are figures in which fine particles are supplied by droplet discharging method.
Figure 5B:
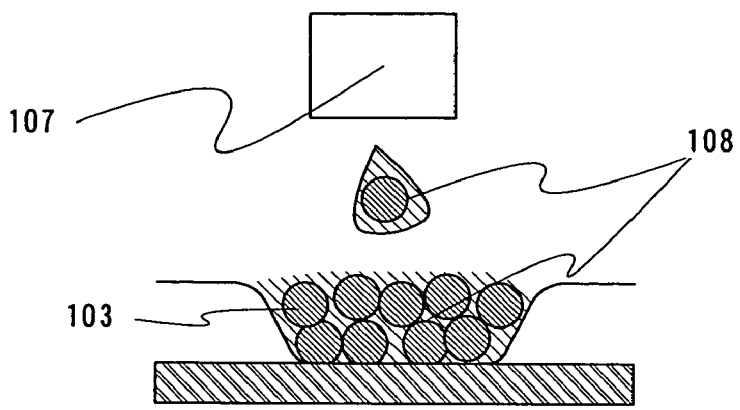
Figure 5C:
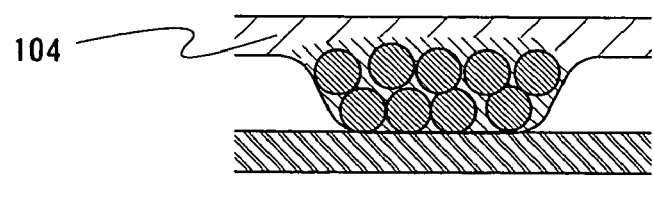
Figure 5C:
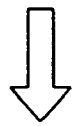
Figure 5D:
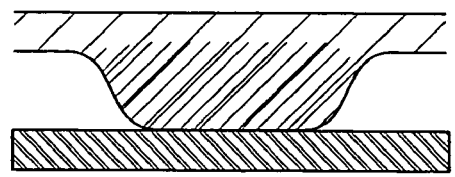

The planarization is enabled as shown in FIG. 2B, and a large step height as in FIG. 2A can be inhibited by applying the invention. Thus, the invention can significantly contribute to improvements in yield and reliability of a semiconductor device, or the like.

Embodiment Mode 2

An embodiment mode of the invention will be described with reference to FIGS. 5A to 5D. In this embodiment mode, a contact hole 102 can be selectively filled with a dispersion liquid 108 containing the conductive fine particles 103 by employing droplet discharging method, thereby obtaining planarity.

The droplet discharging method is commonly referred to as an ink-jet method. In the technology, droplets of a solution to be applied are discharged from a nozzle 107 and applied to a certain area. In the invention, the technology is applied using a special ink in which the conductive fine particles 103 are dispersed.

The contact hole 102 formed in the insulating film 101 is filled with the dispersion liquid 108 containing the conductive fine particles 103 discharged from the nozzle 107 of a drop discharging device so that the wiring 104 can be electrically connected to the conductive layer 100 in the lower layer.

Figure 6:
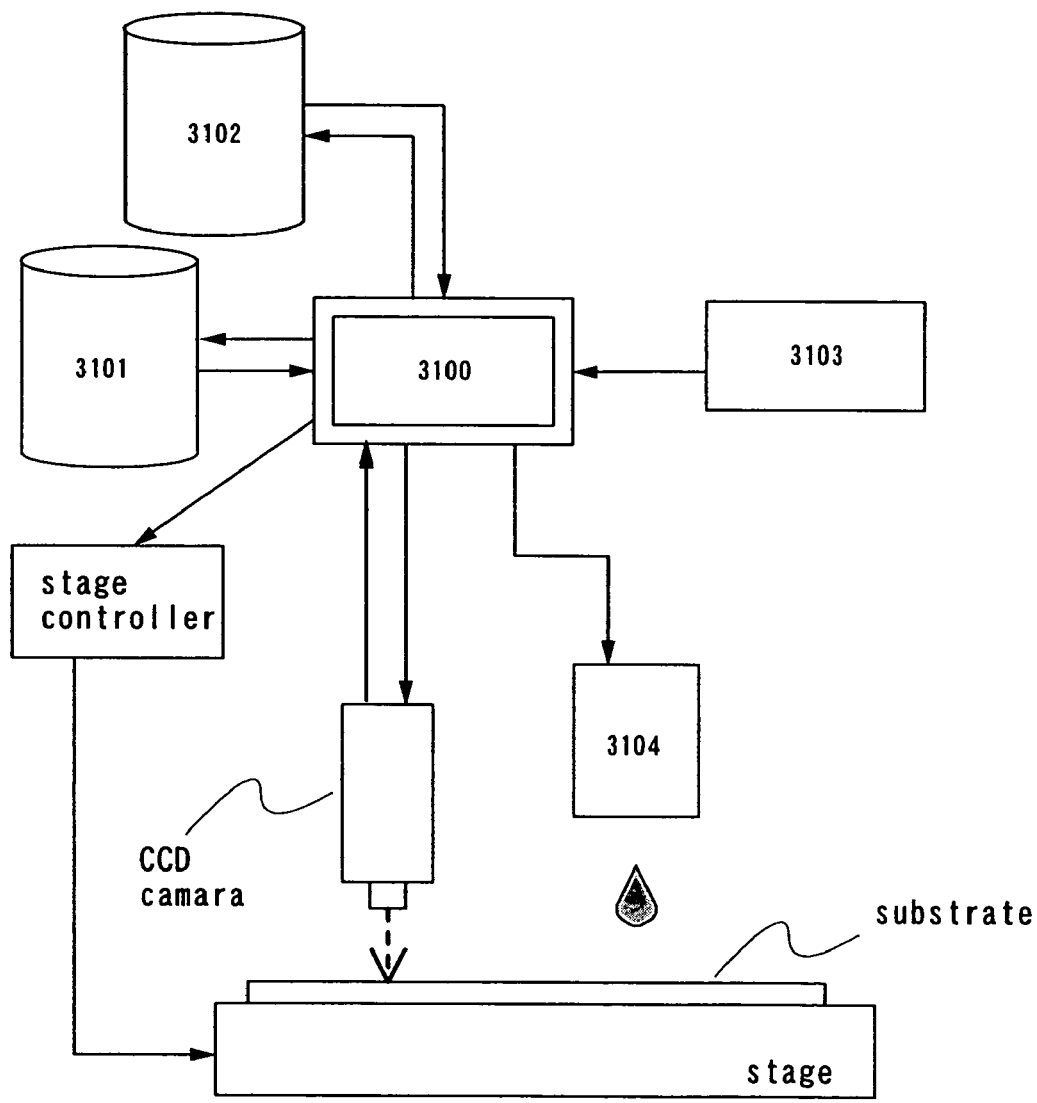
FIG. 6 is a control block diagram of droplet discharging method.

The filling of the contact hole by droplet discharging method may be computer controlled. In that case, the position of the contact hole is determined in accordance with data of such as a mask pattern, and the contact hole is precisely filled by being aligned using preformed alignment marks. A control method with the use of mask data is briefly shown with reference to a block diagram (FIG. 6).

As basic components of a drop discharging device, a CPU 3100, a volatile memory 3101, a nonvolatile memory 3102, an input means 3103 such as a keyboard and an operation button, and a drop discharging means 3104 are given. The behavior will be briefly described. After the mask data is inputted by the input means, the data is stored in the volatile memory 3101 or the nonvolatile memory 3102 through the CPU 3100. Subsequently, the fine particle dispersion liquid can be selectively discharged when the CPU 3100 transmits an instruction based on the data to a stage controller or/and the droplet discharging means 3104; thus, the wiring can be formed. Further, the fine particle dispersion liquid may be selectively applied by collecting information of a substrate as an image from a CCD camera, and analyzing the image.

After the contact hole is filled with the conductive fine particles 103, a wiring is formed by droplet discharging method or by sputtering. In the case of sputtering, after the conductive film is formed, the wiring is formed by patterning and etching. A mask used for patterning may be formed by a conventional photoresist method; however, it is preferable to form the mask by droplet discharging method, since a wide range of mask options can be provided and the waste of materials can be avoided.

One or more selected from fine particles (including ultrafine particles, nanoparticles, and the like) of elements such as Al, In, Sn, Pb, Ge, Ga, Zn, Cu, Ag, Au, Ti, Ni, Ta, and W and compounds thereof can be used for material of the conductive fine particles 103. A dispersion liquid in which the conductive fine particles 103 are dispersed in an organic solvent may be used. The diameter of a fine particle may be in the range of from several nanometers to several micrometers as long as the fine particle can be dispersed uniformly in a suitable solvent. A nozzle of a drop discharging device is required to be adjusted in accordance with the diameter of the fine particle.

It is required that evaporating temperature of the organic solvent to be used is not too low. One or mixture of a petroleum spirit, tridecane, dodecylbenzene, α-terpineol, hydrocarbon containing five or more carbon atoms, alcohol, ether, ester, ketone, an organic nitrogen compound, an organosilicon compound, and an organosulphur compound which has relatively high evaporating temperature (more than 150° C.) can be used for the organic solvent. Further, it is known that dispersibility of the conductive fine particles 103 is improved by being added with a small amount of surfactant. Nano metal ink such as perfect silver or perfect gold of Vacuum Metallurgical Co., Ltd. is available as such dispersion liquid.

In this embodiment mode, the wiring 104 is formed after selectively filling the step of the contact hole 102 with the dispersion liquid 108 containing the conductive fine particles 103 by using a droplet discharging method. Consequently, unevenness due to the contact hole 102 is alleviated to some extent without performing a reflow process, and further, even a contact hole with a diameter of 1 μm or more can be planarized; thus, defects such as disconnection and high resistivity can be reduced. Further, the factors of the display defect in a display device are reduced, and the yield can be improved as a result.

When reflow is performed, taking into account the affinity with the wiring 104 and the heat resistance of other materials including a substrate, one or more selected from fine particles (including ultrafine particles, nanoparticles, or the like) of elements such as Al, In, Sn, Pb, Ge, Ga, Zn, Cu, Ag and Au and compounds thereof may be used for the material of the conductive fine particles 103. A dispersion liquid in which the conductive fine particles 103 are dispersed in an organic solvent may be used. Unevenness due to a contact hole can be alleviated by performing a reflow process, and the reliability can be improved. A solvent to be used and the applicable diameter of a fine particle are the same as given in the case where reflow is not performed.

For example, when an Al—Ge alloy is selected for the material of the wiring 104, the contact hole 102 is filled with fine particles of In. In this case, the Al—Ge alloy is reflowed by heating at approximately 350° C.; meanwhile, the melting point of In is 156° C. Therefore, combination or alloying can be performed as well as reflow. Consequently, the planarity is improved as well as reliability of the connection.

Further, in this embodiment mode, the dispersion liquid 108 containing the conductive fine particles 103 may selectively be applied to the depression of the contact hole 102 after the wiring is formed, thereby achieving similar effect.

Embodiment Mode 3

Another embodiment mode of the invention will be described with reference to FIGS. 7A to 7E. A dispersion liquid 108 of conductive fine particles 103 is applied all over the insulating film where a contact hole 102 is formed by an application method such as spin coating so as to be connected to a conductive layer 100. Next, a material having a shape which does not damage the substrate surface, such as a silicon resin plate (in this embodiment mode, a spatula 111 of silicon resin is used) is pushed to the substrate surface and moved so as to fill the contact hole 102 with the applied dispersion liquid 108 containing the conductive fine particles 103. Concurrently, the dispersion liquid 108 containing the conductive fine particles 103 adhered to an undesired portion is removed. Thus, only inside the contact hole 102 can be selectively filled with the dispersion liquid 108 containing the conductive fine particles 103.

Other than by spin coating, the contact hole can also be filled by immersing the substrate in the dispersion liquid 108 containing the conductive fine particles 103 and pulling the substrate up at a constant rate. After the contact hole 102 is filled, the similar treatment as in the case of spin coating may be performed. Hereupon, the dispersion liquid applied to the portion where no element is formed may also be removed as necessary.

One or more selected from fine particles (including ultrafine particles, nanoparticles, and the like) of elements such as Al, In, Sn, Pb, Ge, Ga, Zn, Cu, Ag, Au, Ti, Ni, Ta, and W and compounds thereof can be used for material of the conductive fine particles 103. A dispersion liquid 108 in which the conductive fine particles 103 are dispersed in an organic solvent may be used. The diameter of a fine particle may be in the range of from several nanometers to several micrometers as long as the fine particle can be dispersed uniformly in a suitable solvent. A nozzle of a drop discharging device is required to be adjusted in accordance with the diameter of the fine particle.

It is required that evaporating temperature of the organic solvent to be used is not too low. One or mixture of a petroleum spirit, tridecane, dodecylbenzene, α-terpineol, hydrocarbon containing five or more carbon atoms, alcohol, ether, ester, ketone, an organic nitrogen compound, an organosilicon compound, and an organosulphur compound which has relatively high evaporating temperature (more than 150° C.) can be used for the organic solvent. Further, dispersibility of the conductive fine particles 103 is improved by being added with a small amount of surfactant. Nano metal ink such as perfect silver and perfect gold of Vacuum Metallurgical Co., Ltd. are given as examples of such dispersion liquid.

After the contact hole 102 is filled with the dispersion liquid 108 containing the conductive fine particles 103, a wiring 104 is formed by a liquid discharging method or by sputtering, through a bake process if necessary. A mask used for patterning may be formed by a conventional photoresist method; however, it is preferable to form the mask by droplet discharging method, since a wide range of mask options can be provided and the waste of materials can be avoided.

In this embodiment mode, the wiring can be formed after selectively filling the step of the contact hole 102 with the dispersion liquid 108 containing the conductive fine particles 103. Further, the dispersion liquid 108 containing the conductive fine particles 103 applied to an undesired portion can be removed. Consequently, unevenness due to the contact hole 102 is alleviated without performing reflow, and further, even a contact hole with a diameter of 1 μm or more can be planarized; thus, defects such as disconnection and high resistivity can be reduced. Further, the factors of the display defect are reduced in a display device, and the yield can be improved as a result.

When reflow is performed, taking into account the affinity with the wiring and the heat resistance of other materials including a substrate, one or more selected from fine particles (including ultrafine particles, nanoparticles, or the like) of elements such as Al, In, Sn, Pb, Ge, Ga, Zn, Cu, Ag, and Au and compounds thereof may be used for the material of the conductive fine particles 103. A dispersion liquid in which the conductive fine particles 103 are dispersed in an organic solvent may be used. A solvent to be used and the applicable diameter of a fine particle are the same as given in the case where reflow is not performed. More planarity can be obtained by performing a reflow process, and the reliability and the yield of a semiconductor device can be improved.

When an Al—Ge alloy is selected for the wiring material, the contact hole is filled with fine particles of In. Since the Al—Ge alloy is reflowed by heating at approximately 350° C., meanwhile, the melting point of In is 156° C.; combination or alloying as well as reflow can be performed. Consequently, the reliability of the connection as well as planarity is improved.

In this embodiment mode, the dispersion liquid 108 containing the conductive fine particles 103 which are adhered to the undesired portion may be removed after the wiring. In that case, it should be noted that the wiring formed in the upper part must not be damaged. Further, unnecessary fine particles may be removed by cleaning with the use of a solvent.

Embodiment Mode 4

Another embodiment mode of the invention will be described with reference to FIGS. 8A to 8E. The conductive fine particles 103 are dispersed all over the insulating film 101 where the contact hole 102 is in contact with a conductive layer 100 formed in the lower layer by using a dispersion device. A dispersion device as disclosed in Japanese Patent Laid-Open No. 2002-59047 may be used for the dispersion device. In addition, a device for dispersing spacers used in fabricating a display device may be used.

Further, in this embodiment mode, since the conductive fine particles 103 are used in the form of powder, when too minute particles are applied, the particles would be agglomerated due to surface energy. In order to avoid the agglomeration, some measure may be desirably taken, for example, plating the surface of the fine particles, or the like.

Next, the conductive fine particles 103 in an undesired portion may be removed by using a material having a shape which does not damage the substrate surface, such as a silicon resin plate (in this embodiment mode, a spatula 111 of silicon resin is used). Thus, the contact hole 102 can be selectively filled with the conductive fine particles 103 in advance.

When the contact hole 102 is not fully filled with the conductive fine particles 103, the dispersion and the removal may be performed afresh. When the density of the conductive fine particles 103 in the contact hole is increased by repeating dispersion, even conductive fine particles with larger size should be agglomerated. Thus, the conductive fine particles are thick in the contact hole and are hardly scattered. Accordingly, the removal of the conductive fine particles 103 in the undesired portion becomes easier.

Further, in order to fill the contact hole 102 fully with the conductive fine particles 103, the conductive fine particles 103 may be sunk in the contact hole 102 by ultrasonic vibration. After the conductive fine particles 103 are sunk in the contact hole 102, the conductive fine particles 103 adhered to an undesired portion may be removed by using a material having a shape which does not damage the substrate surface, such as a silicon resin plate (in this embodiment mode, a spatula 111 of silicon resin is used).

Further, the conductive fine particles 103 adhered to the area other than the contact hole 102 may be scraped off by using a pad as used in CMP (chemical mechanical polishing) instead of a plate (spatula).

One or more selected from fine particles (including ultrafine particles, nanoparticles, and the like) of elements such as Al, In, Sn, Pb, Ge, Ga, Zn, Cu, Ag, Au, Ti, Ni, Ta, and W, and compounds thereof may be used for material of the conductive fine particles 103 depending on the affinity of wettability with the wiring 104. The wettability of the fine particles with the wiring is preferably high, and the reliability of the contact formation can be improved.

After the contact hole is filled with the conductive fine particles 103, the wiring 104 is formed by droplet discharging method or by sputtering. In the case of sputtering, after the conductive film is formed, the wiring 104 is formed by patterning and etching. A mask used for patterning may be formed by a conventional photoresist method; however, it is preferable to form the mask by droplet discharging method, since a wide range of mask options can be provided and the waste of materials can be avoided.

In this embodiment mode, the wiring can be formed after filling the step of the contact hole 102 with the conductive fine particles 103; further, the conductive fine particles 103 in an undesired portion may be scratched off. Consequently, unevenness due to the contact hole 102 is alleviated without performing reflow, and further, even a contact hole with a diameter of 1 μm or more can be planarized; thus, defects such as disconnection and high resistivity can be reduced. Further, the factors of the display defect are reduced in a display device, and the yield can be improved as a result.

When reflow is performed, taking into account taking into account the affinity with the wiring 104 and the heat resistance of other materials including a substrate, one or more selected from fine particles (including ultrafine particles, nanoparticles, or the like) of elements such as Al, In, Sn, Pb, Ge, Ga, Zn, Cu, Ag, and Au and compounds thereof may be used for the material of the conductive fine particles 103. When an Al—Ge alloy is selected for the material of the wiring 104, the contact hole is filled with fine particles of In. Thus, since the Al—Ge alloy is reflowed by heating at approximately 350° C., meanwhile, the melting point of In is 156° C.; combination or alloying as well as reflow can be performed. Consequently, the reliability of the connection as well as planarity is improved.

In this embodiment mode, the conductive fine particles 103 which are adhered to the undesired portion may be removed after forming the wiring. In that case, it should be strongly noted that the wiring formed in the upper part should not be damaged. In this case, unnecessary fine particles may be removed by cleaning with the use of a solvent.

Embodiment Mode 5

Another embodiment mode of the invention will be described with reference to FIGS. 10A to 10E. In this embodiment mode, unevenness due to a contact hole 102 is alleviated by forming a columnar conductor 112 in the contact hole 102 which is formed so as to be electrically connected to a conductive layer 100 in the lower layer.

The columnar conductor can be formed by droplet discharging method. The columnar conductor 112 is formed by discharging droplets of dispersion liquid 108 containing conductive fine particles 103 to a portion in the contact hole 102. Herewith, the columnar conductor can be formed more easily if the dispersion liquid 108 containing the conductive fine particles 103 has high viscosity. When the viscosity of the dispersion liquid 108 containing the conductive fine particles 103 is not changed, the partial pressure of the solvent in the atmosphere where the columnar conductor 112 is formed is reduced to less than the case of forming the wiring; thus, the solvent is easily volatilized.

Further, the columnar conductor 112 may be formed by photolithography. First, a conductive film 109 may be formed in the contact hole 102 by a known thin film formation method such as sputtering, spin coating, or CVD. Next, a mask 110 is formed over the contact hole by photolithography or a droplet discharging method; the columnar conductor is formed in the contact hole 102 by patterning the conductive film and etching it by dry etching.

One or more selected from fine particles (including ultrafine particles, nanoparticles, and the like) of elements such as Al, In, Sn, Pb, Ge, Ga, Zn, Cu, Ag, Au, Ti, Ni, Ta, and W, and compounds or alloys thereof may be used for material of the columnar conductor 112 depending on the affinity of wettability with the wiring 104. The wettability of the conductor with the wiring is preferably high, and the reliability of the contact formation can be improved.

After the columnar conductor 112 is formed in the contact hole, a wiring material is applied in the form of film to form the wiring 104 by droplet discharging method or by sputtering. In the case of sputtering, after the conductive film is formed, the wiring 104 is formed by patterning and etching. A mask used for patterning may be formed by a conventional photoresist method; however, it is preferable to form the mask by droplet discharging method, since a wide range of mask options can be provided and waste of materials can be avoided.

In this embodiment mode, the wiring 104 can be formed after selectively filling the step of the contact hole 102 with the columnar conductor 112. Consequently, unevenness due to the contact hole 102 is alleviated without performing reflow, and further, even a contact hole with a diameter of 1 μm or more can be planarized; thus, defects such as disconnection and high resistivity can be reduced. Further, the factors of the display defect are reduced in a display device, and the yield can be improved as a result.

One or more selected from fine particles (including ultrafine particles, nanoparticles, and the like) of elements such as Al, In, Sn, Pb, Ge, Ga, Zn, Cu, Ag, Au, Ti, Ni, Ta, and W, and a compound or an alloy thereof may be used as a material for the columnar conductor 112 taking into account the affinity with the wiring 104 and the heat resistance of other materials including a substrate.

Embodiment 1

A fabrication method of an active matrix liquid crystal display device will be described as an example of the invention with reference to FIGS. 11A to 11D and 12A to 12D. In this embodiment, a fabrication method of a semiconductor device using droplet discharging method is applied; however, the invention can be naturally applied to a conventional process employing photolithography.

Here a fabrication process of an active matrix liquid crystal display device in which an n-channel TFT (for switching) and a capacitor are formed over one substrate employing the invention will be described.

Figure 11A:
FIGS. 11A to 11D are figures which show an embodiment of the invention.

A substrate which withstands the process temperature of the process, such as a glass substrate or a flexible substrate typified by a plastic substrate is used for a substrate 601 (FIG. 11A). Specifically an active matrix substrate is made with a light transmitting substrate 601. The substrate with a large area as 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm is desirably used thereby reducing manufacturing costs. A substrate of barium borosilicate glass, aluminoborosilicate glass, or the like, as typified by #7059 glass or #1737 glass produced by Corning Inc. can be used. In addition, a light transmitting substrate such as a quartz substrate or a plastic substrate can be used alternatively.

In this embodiment, a glass substrate 601 is used. A base film 602 which is formed from an insulating film is formed over the substrate 601. The base film may have either a single layer or a layered structure. In this embodiment, a bilayer structure is used. A 50 nm thick silicon nitride oxide film is formed for the first layer, and a 50 nm thick silicon oxynitride film is formed for the second layer; the surface is thereafter planarized by a method such as CMP (FIG. 11A).

A semiconductor layer 603 is formed over the base film 602. The semiconductor layer 603 is formed with a thickness of from 25 nm to 80 nm by a known method (such as sputtering, LPCVD or plasma CVD). The semiconductor layer is then crystallized by a known crystallization method (such as laser crystallization, thermal crystallization using RTA or an annealing furnace, or thermal crystallization using a metal element which promotes the crystallization). As the semiconductor layer, an amorphous semiconductor film, a microcrystalline semiconductor film, or a crystalline semiconductor film may be used. Further, a compound semiconductor film having an amorphous structure such as an amorphous silicon germanium film may be used.

Figure 11B:
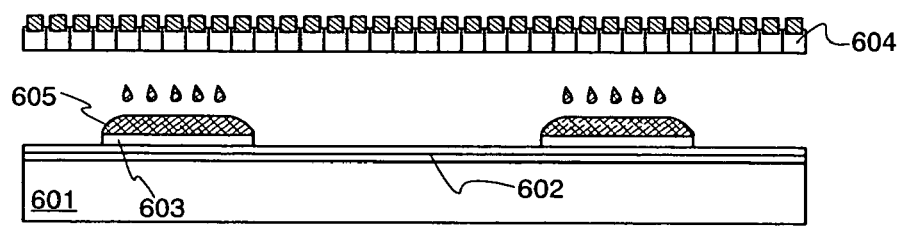

In this embodiment, a 50 nm thick amorphous silicon film is formed as the semiconductor layer 603 by plasma CVD. Then, a solution containing nickel is applied and held over the amorphous silicon film, dehydrogenation (at 500° C. for one hour) is performed on the amorphous silicon film, and then, thermal crystallization (at 550° C. for four hours) is performed thereon, thus forming a crystalline silicon film. Thereafter, a mask pattern is formed with a resist 605, which is discharged from an inkjet nozzle 604 by droplet discharging method. The semiconductor layer 603 is formed by dry etching using the mask pattern (FIG. 11B).

Note that, a continuous wave or pulsed gas laser or a solid-state laser may be used as a laser used in the case where the crystalline semiconductor film is formed by laser crystallization. As the former gas laser, an excimer laser, a YAG laser, or the like can be used. As the latter solid-state laser, a laser that uses crystals such as YAG or $YVO_4$ doped with Cr, Nd, or the like is used. Note that, in crystallizing the amorphous semiconductor film, it is preferable to use the solid-state laser capable of continuous oscillation and to use any one of the second harmonic wave through the fourth harmonic wave to the fundamental wave in order to obtain crystals with large grain size. In the case of using the above-mentioned lasers, the laser beam emitted from a laser oscillator is focused to a linear shape by an optical system; thus, the semiconductor film is preferably irradiated with the laser beam.

In this embodiment, since the amorphous silicon film is crystallized by using a metal element that promotes crystallization, the metal element remains in the crystalline silicon film. In order to remove the metal element, an amorphous silicon film with a thickness of from 50 nm to 100 nm is formed over the crystalline silicon film, and a heat treatment (such as RTA or thermal annealing using an annealing furnace) is performed thereon to disperse the metal element into the amorphous silicon film. Subsequently, the amorphous silicon film is etched to remove the metal element. As a result, the metal element content of the crystalline silicon film can be reduced or eliminated. After forming the semiconductor layer 603, a minute amount of impurity elements (boron) may be doped (channel doping) so as to control the threshold value of a TFT.

Then, a gate insulating film 606 covering the semiconductor layer 603 is formed. The gate insulating film 606 is formed of an insulating film containing silicon by plasma CVD or sputtering to have a thickness of from 40 nm to 150 nm. In this embodiment, a silicon oxynitride film is formed to have a thickness of 115 nm by plasma CVD as the gate insulating film 606.

Figure 11C:
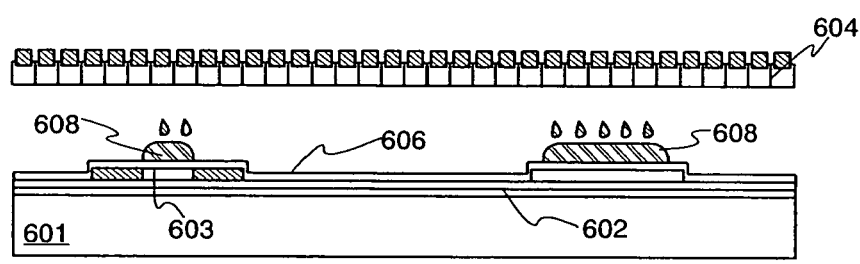

Further, a first conductive layer (such as a gate wiring, a gate electrode, and a capacitor electrode) 608 is formed by droplet discharging method under reduced pressure or in vacuum (FIG. 11C).

An inkjet head includes a plurality of inkjet nozzles. Further, a plurality of inkjet heads each having a different nozzle diameter may be used appropriately depending on usage. In consideration of the throughput, a plurality of nozzles may be arranged so as to have the same length as the length or the breadth of a substrate to form the conductive layer by scanning once. An arbitrary number of nozzles may be provided for recoating, or the same area may be scanned repeatedly for recoating. Further, it is preferable to scan the inkjet head; however, the substrate may be moved instead. The distance between the substrate and the inkjet heads is preferably as short as possible so as to apply a liquid droplet on a desired portion, specifically, appropriately from 0.1 mm to 2.0 mm.

Preferably, the amount of composition discharged from the inkjet head at one time is from 10 pl to 70 pl, the viscosity is 100 cp or less, and the grain size is 0.1 µm or less. This is because the composition would not be smoothly discharged from the inkjet heads when the viscosity is too high. And the above conditions can prevent drying out. Thus, the viscosity, the surface tension, the drying rate, and the like of the composition are properly controlled depending on the solvent to be used and the purpose. Preferably, the composition is discharged from the inkjet heads consecutively to form a linear shape or a stripe on the substrate. Alternatively, the composition may be dropped onto the predetermined spots, per dot, for example.

As the composition discharged from the inkjet head, one in which conductive material arbitrarily selected from an element of tantalum (Ta), tungsten (W), titanium (Ti), molybdenum (Mo), aluminum (Al), silver (Ag), copper (Cu), chromium (Cr), and neodymium (Nd), an alloy material or compound material mainly containing the above elements, an Ag alloy such as an AgPdCu alloy, and an Al alloy, is dissolved and dispersed in a solvent may be used. As the solvent, the following organic solvent may be used: ester such as butyl acetate, and ethyl acetate; alcohols such as isopropyl alcohol, and ethyl alcohol; methyl ethyl ketone; acetone, or the like. The concentration of the solvent may be properly determined according to the types of the conductive materials.

Ultrafine particles (nano metal particles) of silver (Ag), gold (Au), or platinum (Pt) dispersed with a grain size of 10 nm or less may be used for the composition discharged form the inkjet head. The problem of the clogged nozzle can be solved by using the composition in which fine particles with a fine grain size are dispersed or dissolved in the solvent. The grain size of the constituent material of the composition is required to be smaller than the diameter of the nozzle in the present invention using droplet discharging method. Further, a solution of a conductive polymer such as polyethylene dioxythiophene/polystyrenesulfonic acid (PEDT/PSS) solution may be used instead.

When a low resistance metal such as silver or copper is used as a wiring material, the wiring resistance can be lowered, and therefore, such a low resistance metal is preferably used in the case of using a large size substrate. Since these metal materials are difficult to be processed by conventional dry etching, it is extremely effective to pattern these metal materials directly by droplet discharging method. In the case of using copper or the like, for instance, a conductive film having a barrier function, which can hinder dispersion of the copper or the like, is preferably provided so as to avoid an adverse affect on the electric characteristic of a transistor. By using the conductive film having a barrier function, a wiring can be formed without dispersing copper into a semiconductor included in the transistor. As the conductive film having a barrier function, one or more of layered films selected from tantalum nitride (TaN), titanium nitride (TiN), and tungsten nitride (WN) may be used. Preferably, an antioxidant is used together since copper is easily oxidized.

Thereafter, the solvent is volatilized to enhance the density of the composition and reduce the resistance value by performing a heat treatment on the substrate provided with a first conductive layer at a temperature ranging from 150° C. to 300° C. in normal pressure, under reduced pressure, or in vacuum. The solvent in the composition discharged from the inkjet head 604 is preferably the one which evaporates after being dropped on the substrate. In comparison with the case of normal pressure, the evaporation rate is higher in the case where the discharging is performed under reduced pressure. More specifically, when a solvent having higher volatility such as toluene is used, the solvent is immediately volatilized after dropped on the substrate. In that case, the heat treatment step may be omitted. However, the solvent of the composition is not particularly limited, and in the case of using the solvent which evaporates after the dropping, the density of the composition may be enhanced by performing the heat treatment so as to reduce the resistance value to a desired value. The heat treatment may be performed every time a thin film is formed by droplet discharging method or at every specific step, or after finishing the whole steps. Note that the heat treatment step may be omitted when the reflow process is carried out.

A lamp annealing apparatus which directly and rapidly heats the substrate using a lamp such as a halogen lamp as a heat source or a laser irradiation apparatus laser irradiation is used for the heat treatment. Only desired portion can be heat-treated by scanning the heat source of either apparatus. As another method for the heat treatment, an annealing furnace which is set at a predetermined temperature may be used. When a lamp is used, light having a wavelength, which dose not damage the composition of the thin film to be heat-treated and is capable of only heating, is used for irradiation; for example, light having a longer wavelength than 400 nm, namely, light having the longer wavelength than that of infrared light is preferably used. In handling, a far-infrared ray (the typical wavelength is from 4 μm to 25 μm) is preferably used. Meanwhile, when laser beam is used, the beam spot on the substrate of the laser beam oscillated from the laser oscillator preferably has a linear shape so as to have the same length as the length and the breadth of the substrate. Accordingly, the laser irradiation can be finished by scanning at one time. In this embodiment, a normal annealing furnace is used for the heat treatment.

Subsequently, an impurity element imparting n-type or p-type conductivity is doped into the semiconductor layer 603 by using the gate electrode 608 as a mask. In this embodiment, impurity elements imparting n-type and p-type conductivity are respectively doped into the semiconductor layer 603, thereby forming impurity regions. At the same time, a region which is not doped with any impurity elements or a region where is doped with a minute amount of impurity elements (which is generally referred to as a channel region) is formed.

A first interlayer insulating film 609 is formed for covering the entire surface. The first interlayer insulating film 609 is made of an insulating film containing silicon to a thickness of from 40 nm to 150 nm by plasma CVD or sputtering. In this embodiment, a 100 nm thick silicon nitride film is formed as a gate insulating film 606 by plasma CVD. Similarly, a second interlayer insulating film 610 is formed for covering the entire surface. As the second interlayer insulating film 610, a silicon oxide film formed by CVD, a silicon oxide film applied by a SOG (Spin On Glass) method or spin coating, an organic insulating film of such as polysiloxane or acrylic or a non-photosensitive organic insulating film is formed to a thickness of from 0.7 μm to 5.0 μm. A 1.6 μm thick acrylic film formed by an application method is used for the second interlayer insulating film. Further, a silicon nitride film is formed to be 0.1 μm thick as a third interlayer insulating film 611.

Figure 11D:
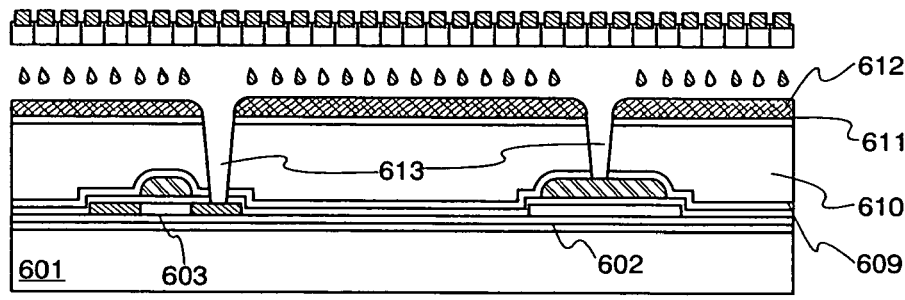

Subsequently, a resist pattern 612 for forming a contact hole 613 is formed by droplet discharging method in a like manner as the above-described case. The contact hole 613 is formed by anisotropic dry etching while using the resist pattern as a mask (FIG. 11D).

As set forth above, the contact hole may be formed by applying the resist. As another method of forming the contact hole, the contact hole may be formed in such a way that an interlayer insulating film 503 is etched by applying an etching solution 506 from a nozzle 505 of an inkjet device as illustrated in FIGS. 13A to 13F. After the formation of the contact hole, the inkjet nozzle is preferably changed to wash the contact hole by dropping cleaning fluid 508 in order to minimize damage to the wiring of the lower layer or a conductive layer 504. In the case where a contact hole is formed by this method, a photolithography process can be omitted; thus, the method has a large cost advantage. Further, a contact hole formed with this method has larger diameter than a contact hole formed by photolithography; however, the invention eliminates the problem of planarity.

Figure 12A:
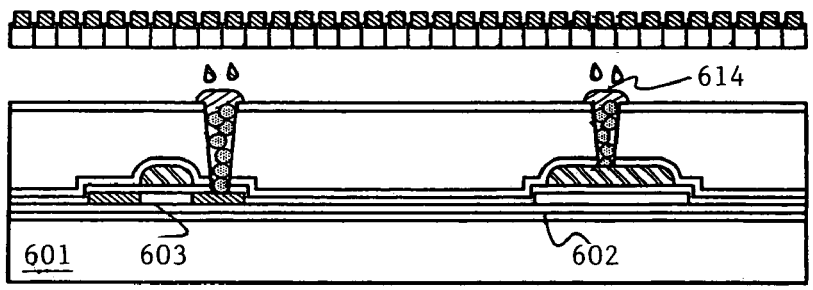
FIGS. 12A to 12D are figures which show an embodiment of the invention.

After the resist patterns 612 is removed, the contact hole is filled with a dispersion liquid of In; thereafter, a second conductive layer (source and drain wiring) 614 is formed by sputtering so as to extend to the bottom of the contact hole 613. In this embodiment, the second conductive layer is formed of Al—Ge alloy, and the proportion of germanium in the alloy is preferably about 1 wt % to 10 wt %. A cross sectional view of the state is shown in FIG. 12A.

Figure 12B:
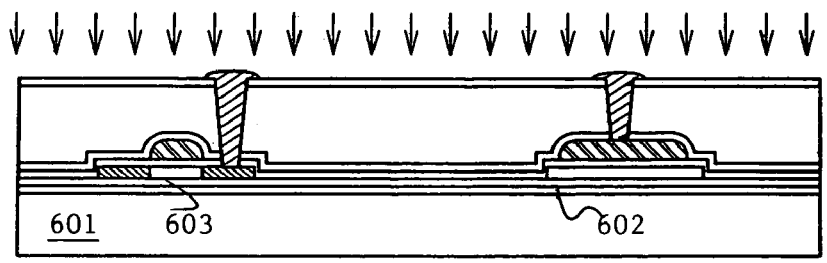

Subsequently, the heat treatment is carried out. The heat treatment may be performed by RTA, GRTA, laser irradiation, lamp heating, or the like. A reflow process is carried out by heating at a temperature of 350° C. since the wiring is made of an alloy of Al and Ge in this embodiment (FIG. 12B). In this embodiment, polyimide is used for the interlayer insulating film. Since polyimide can withstand the heat treatment at about 400° C., a reflow process can be performed even on an organic insulating film.

Through the above steps, unevenness reflecting the form of the contact hole is alleviated, and a leveled transistor can be formed.

Figure 12C:
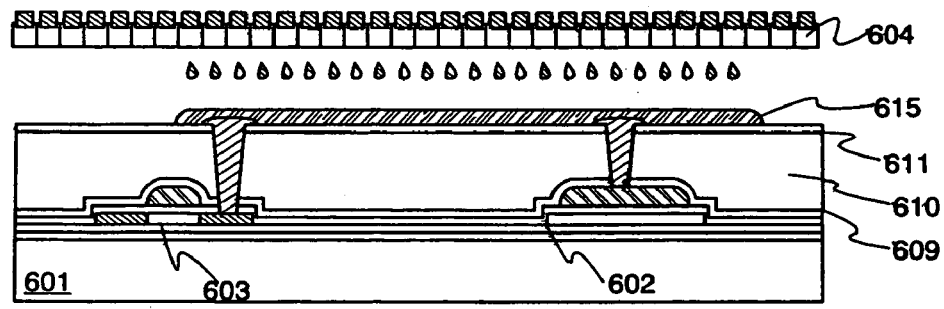

Next, a pixel electrode 615 formed of a transparent conductor is formed on the entire surface so as to electrically connect to the second conductive layer 614 (FIG. 12C). The pixel electrode 615 may be made of, for instance, a compound of indium oxide and tin oxide (ITO), a compound of indium oxide and zinc oxide, zinc oxide, tin oxide, indium oxide, titanium nitride, or the like. In this embodiment, as the pixel electrode 615, an ITO film is formed to a thickness of 0.1 μm by droplet discharging method.

Figure 12D:
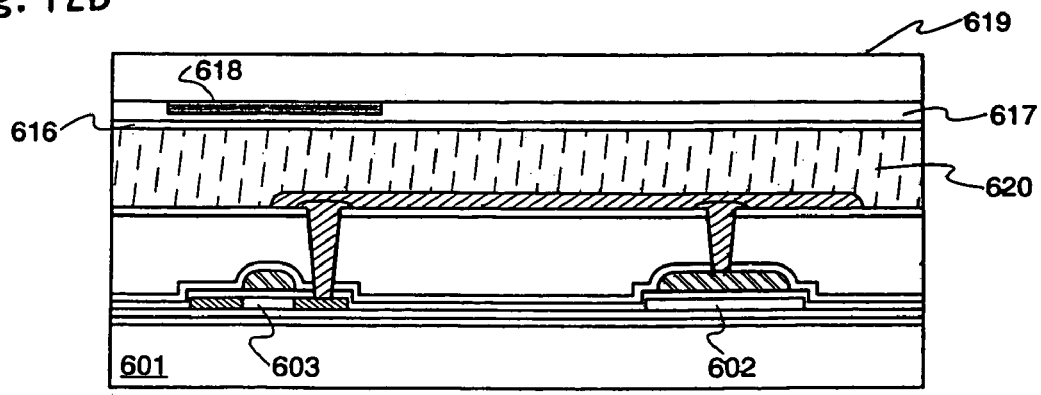
Figure 13A:
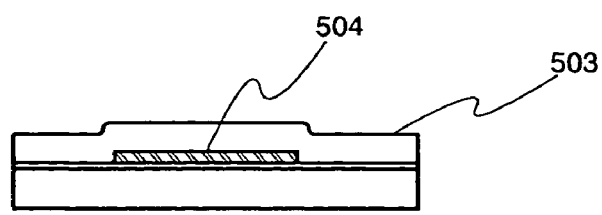
FIGS. 13A to 13F are figures which show an embodiment of the invention.
Figure 13B:
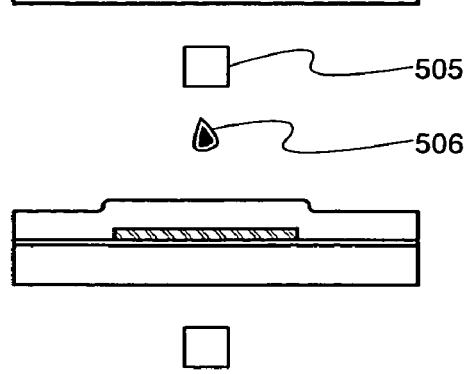
Figure 13C:
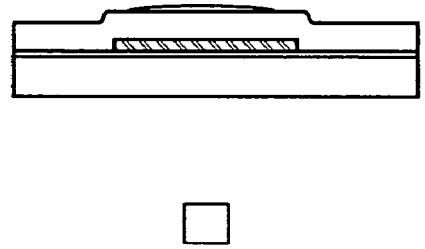
Figure 13D:
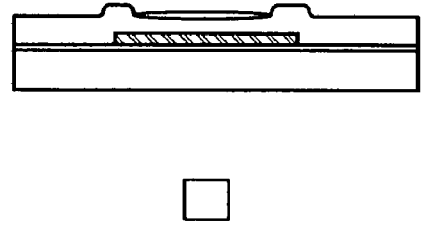
Figure 13E:
Figure 13F:
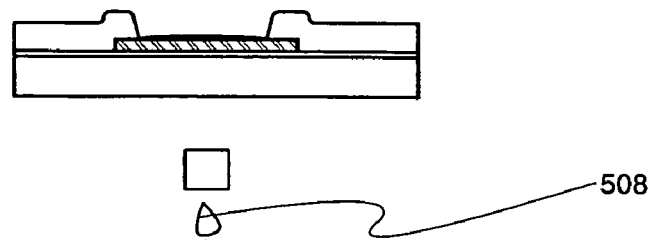

Accordingly, an active matrix substrate having a pixel area including a source wiring, a TFT, and a storage capacitor, and a terminal area can be manufactured. If necessary, the active matrix substrate or a counter substrate is cut to the desired shape. Subsequently, thus obtained active matrix substrate is attached to a counter substrate 619 on which a common electrode 616, a color filter 617, a black matrix 618 and the like are formed. Liquid crystal 620 is injected with a certain technique, and hence, a liquid crystal display device is completed (FIG. 12D).

A liquid crystal module fabricated according to the foregoing steps is equipped with a backlight and an optical waveguide and covered with a cover material, and hence, an active matrix liquid crystal display device (a transmissive type) can be completed. Note that the cover material is bonded to the liquid crystal module by using an adhesive, an organic resin, and the like. Since the active matrix liquid crystal display device is a transmissive type, polarizing plates are attached to each side of the active matrix substrate and the counter substrate.

Although this embodiment shows a transmissive liquid crystal display device, the invention is not limited thereto, and a reflective liquid crystal display device, a transflective liquid crystal display device, or the like can also be manufactured. In the case of manufacturing a reflective liquid crystal display device, the pixel electrode may be formed of a metal film having higher light reflectance, more specifically, a material film containing aluminum or silver as its main component, a stack thereof, or the like.

With respect to a portion which is necessary to be highly integrated such as a driving circuit portion, when the wiring is partially formed by combining this embodiment with Embodiment Mode 3 or Embodiment Mode 4, the reliability can be further improved. Naturally, the wiring can be formed over the entire surface.

As above, the active matrix liquid crystal display device according to Embodiment 1 of the invention has been described. However, the invention is not limited to Embodiment 1, and can similarly be applied based on the scope of the invention. For example, the present invention can also be applied to the case of an active matrix organic EL display device. The materials or the formation method described in this embodiment can be used appropriately and selectively in accordance with the scope of the invention.

This embodiment can be appropriately combined with the embodiment modes and other embodiments.

Embodiment 2

Embodiment 2 of the invention will be described in more detail with reference to FIGS. 14A to 14E and FIGS. 15A to 15D. In this embodiment, a liquid crystal display device is partly used in a process for fabricating a semiconductor device; however, the invention can be naturally applied to a process using photolithography. The use or disuse of the conventional process is entrusted to those who employ the invention.

Figure 14A:
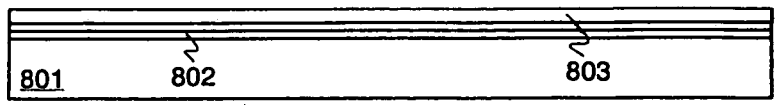
FIGS. 14A to 14E are figures which show an embodiment of the invention.
Figure 15A:
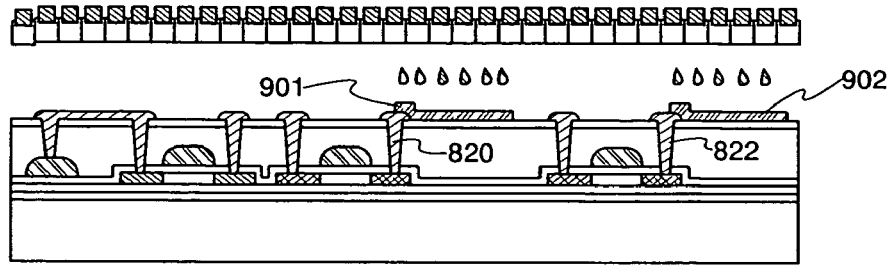
FIGS. 15A to 15D are figures which show an embodiment of the invention.

A glass substrate, a flexible substrate typified by a plastic substrate, or the like, which can withstand the processing temperature of the steps, is used for a substrate 801 (FIG. 15A). In this embodiment, the substrate 801 is made of glass. A base film 802 made of an insulating film is formed over the substrate 801. The base film 802 may have either a single layer structure or a layered structure. In this embodiment, the base film has a bilayer structure. A 50 nm thick silicon nitride oxide film is formed for the first layer and a 50 nm thick silicon oxynitride film is formed for the second layer by sputtering for the two layers of the base film. Then the surface is leveled by CMP, or the like (FIG. 14A).

Subsequently, a semiconductor layer 803 is formed over the base film 802. As the semiconductor layer 803, a semiconductor film is formed to a thickness of from 25 nm to 80 nm by a known method (such as sputtering, LPCVD, or plasma CVD). Then, the semiconductor film is crystallized by a known crystallization method (such as laser crystallization, thermal crystallization using RTA or an annealing furnace, and thermal crystallization using a metal element which promotes crystallization). Note that, an amorphous semiconductor film, a microcrystalline semiconductor film, a crystalline semiconductor film, a compound semiconductor film with an amorphous structure such as an amorphous silicon germanium film, or the like may be used as the semiconductor film.

In the like manner as Embodiment 1, a 50 nm thick amorphous silicon film is formed by plasma CVD in this embodiment. A solution containing nickel is applied and held over the amorphous silicon film; dehydrogenation (at 500° C. for 1 hour) is performed on the amorphous silicon film; and thermal crystallization (at 550° C. for 4 hours) is performed thereon, thereby forming a crystalline silicon film. Thereafter, patterning is performed by discharging resist from an inkjet head 807 under reduced pressure or in vacuum. Thus, semiconductor layers 804 to 806 are formed by dry etching using the resist pattern as a mask (FIG. 14B).

Subsequently, a gate insulating film 809 is formed. As the gate insulating film 809, a silicon oxynitride film is formed to a thickness of 115 nm by plasma CVD (FIG. 14B).

Figure 14B:
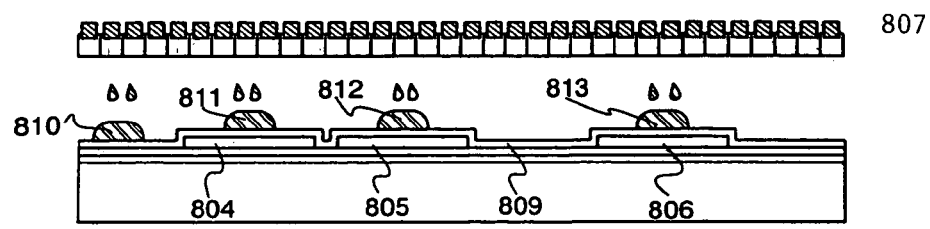

As in Embodiment 1, first conductive layers (gate wirings and a gate electrode) 810 to 813 are made of a tungsten film under reduced pressure or in vacuum (FIG. 14B).

Thereafter, the solvent is volatilized to obtain good electrical conductivity by heat treating the substrate with provided with the first conductive layers at a temperature ranging from 150° C. to 300° C. in normal pressure, under reduced pressure, or in vacuum. The solvent in the composition discharged from the inkjet head 807 is preferably the one which evaporates after being applied to the substrate. In particular, when a solvent having higher volatility such as toluene is used, the solvent is volatilized immediately after being applied to the substrate. In such a case, the heat treatment step may be omitted. However, the solvent of the composition is not particularly limited thereto, and in the case of using the solvent which evaporates after the dropping, the viscosity of the composition may be reduced to obtain the desired viscosity value by performing the heat treatment. The heat treatment may be performed every time a thin film is formed by droplet discharging method or at every specific step, or after finishing the whole steps. In the case of performing a reflow process, the heat treatment step may be omitted.

Subsequently, an impurity element imparting n-type or p-type conductivity is doped into the semiconductor layers 804 to 806 using the gate electrodes 811 to 813 as masks. In this embodiment, an impurity element imparting n-type conductivity is doped into the semiconductor layer 804, and an impurity element imparting p-type conductivity is doped into the semiconductor layers 805 and 806, thereby forming impurity regions. At the same time, a region which is not doped with any impurity elements or a region which is doped with a small amount of impurity elements (which is generically referred to as a channel region) is formed.

A first interlayer insulating film 814 is formed for covering the entire surface. The first interlayer insulating film 814 is made of an insulating film containing silicon to a thickness of from 40 nm to 150 nm by plasma CVD or sputtering. In this embodiment, a 100 nm thick silicon nitride film is formed as the first interlayer insulating film 814 by plasma CVD. Similarly, a second interlayer insulating film 815 is formed for covering the entire surface. As the second interlayer insulating film 815, a silicon oxide film formed by CVD, a silicon oxide film applied by a SOG (Spin On Glass) method or spin coating, an organic insulating film of such as polysiloxane, polyimide, or acrylic or a non-photosensitive organic insulating film is formed to a thickness of from 0.7 µm to 5.0 µm. A 1.6 µm thick acrylic film formed by an application method is used for the second interlayer insulating film. Further, a silicon nitride film is formed to be 0.1 µm thick as a third interlayer insulating film 816.

Figure 14C:
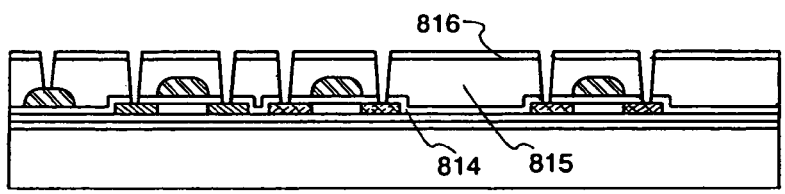
Figure 14D:
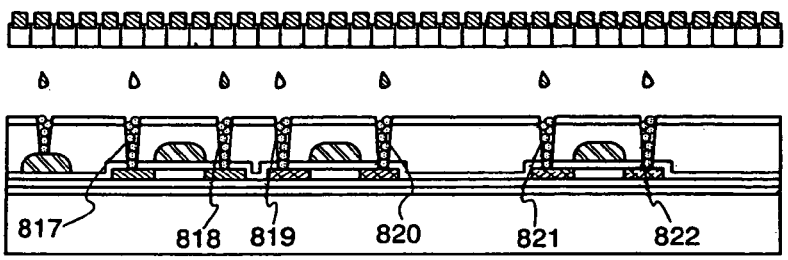
Figure 14E:
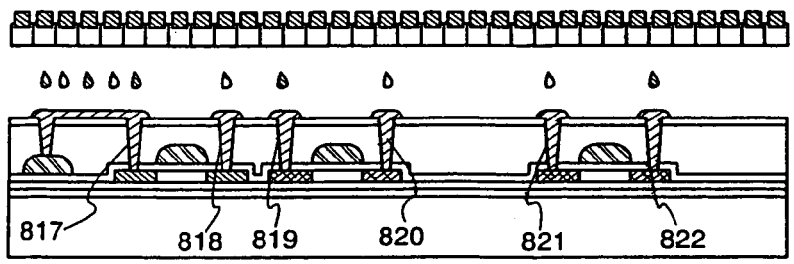

Subsequently, a resist patterns for forming a contact hole is formed by droplet discharging method in the like manner as the above-described case. The contact hole is formed by anisotropic dry etching using the resist pattern as a mask (FIG. 14C).

Next, second conductive layers (source and drain wirings) 817 to 822 are formed so as to extend to the bottom of the contact holes. In this embodiment, the second conductive layers are formed with an alloy film of aluminum and germanium by sputtering though mask formation and etching by photolithography. Instead of forming the mask by photography, a mask material may be formed by droplet discharging method. In this case, the waste of the mask material can be preferably eliminated.

The ratio of germanium to aluminum is preferably about 1 wt % to 10 wt %. The wiring material is not limited thereto, and can be selected appropriately taking into account the reflow temperature or the heat resistance.

In thus formed wiring pattern, unevenness due to a contact hole or the like is generated. Therefore, the depression of the contact hole is selectively filled with the conductive fine particles 103 by droplet discharging method. Fine particles of such as indium are preferably used for the conductive fine particles 103. A dispersion liquid in which such fine particles are dispersed in an organic solvent is preferably used for the droplet discharging method.

Figure 7A:
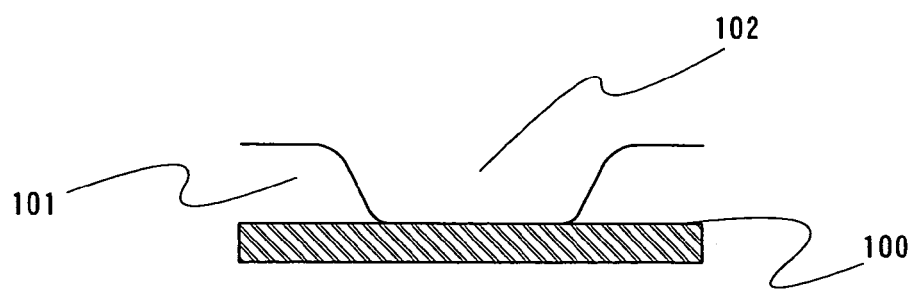
FIGS. 7A to 7E are figures in which fine particles are supplied by spin coating with a dispersion liquid.
Figure 7B:
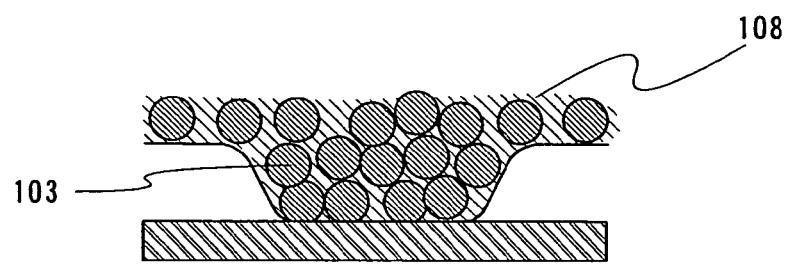
Figure 7C:
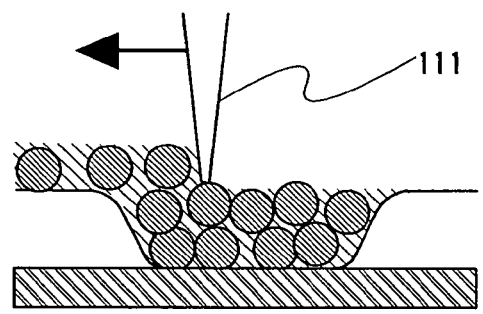
Figure 7D:
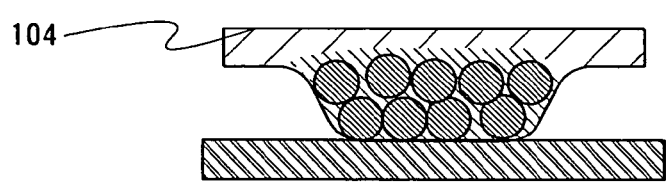
Figure 7D:
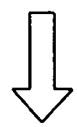
Figure 7E:
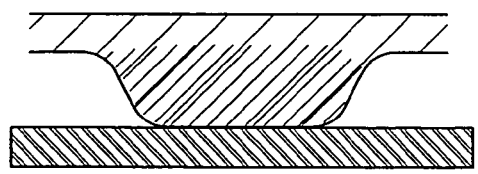

Subsequently, heat treatment is carried out. The heat treatment may be performed by RTA, GRTA, laser irradiation, lamp heating, or the like. A reflow process is performed by heating at a temperature of 350° C. since the wiring is made of an alloy of Aluminum and Germanium in this embodiment. Since indium melts at approximately 154° C., the fine particles containing indium melts concurrently with the lower layer of the wiring and is united with the wiring. Thus, the unevenness reflecting the shape of the contact hole and the nonuniformity of the shape of the wiring due to the drying process of the organic solvent can be alleviated. According to the forgoing processes, a transistor can be formed over the substrate 801 having an insulating surface. A cross sectional view of the state is shown in FIG. 7D.

Figure 8A:
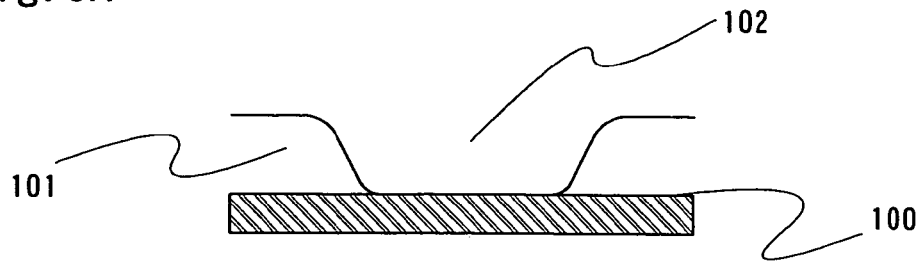
FIGS. 8A to 8E are figures in which fine particles are supplied by sprinkling.
Figure 8B:
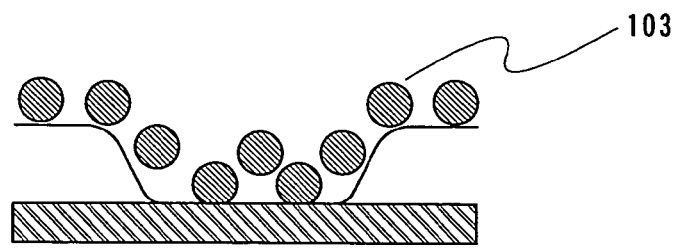
Figure 8C:
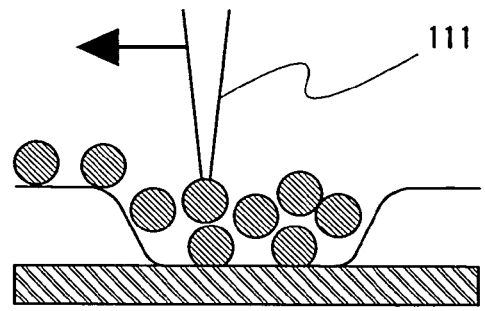
Figure 8D:
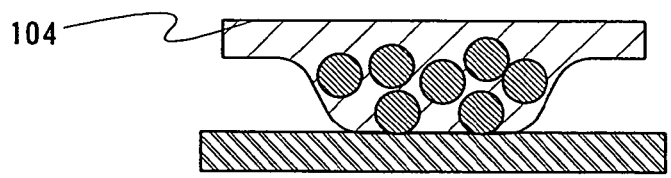
Figure 8D:
Figure 8E:
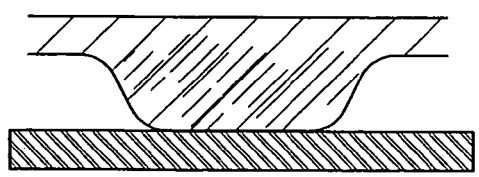
Figure 9A:
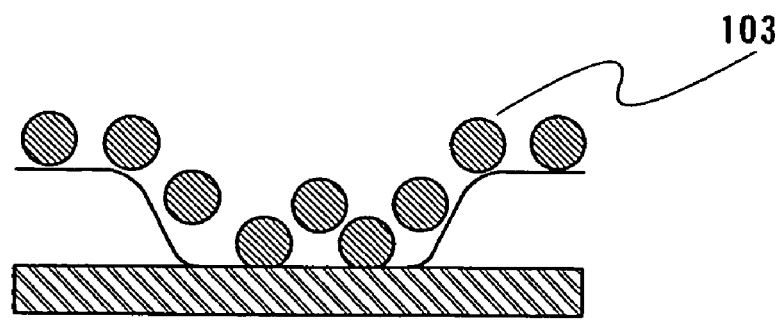
FIG. 9A to 9C are figures in which a contact hole is filled with sprinkled fine particles by ultrasonic vibration.
Figure 9B:
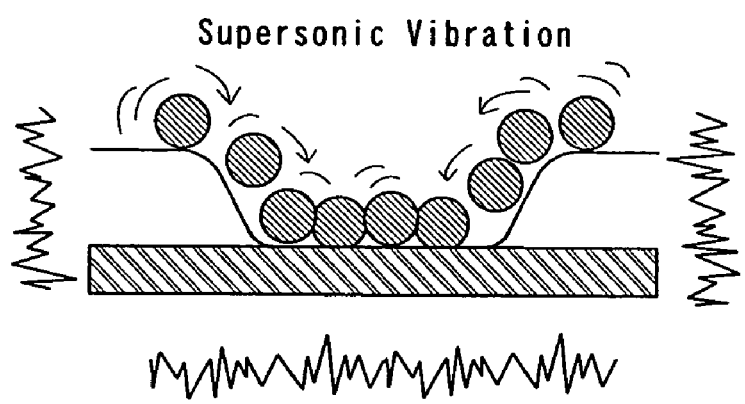
Figure 9C:
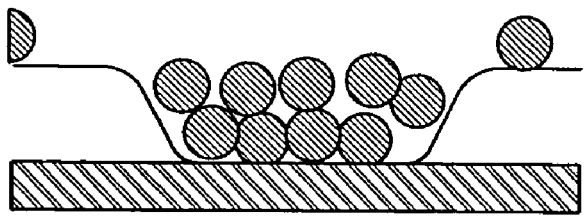
Figures 10A, 10B, 10C, 10D, 10E:
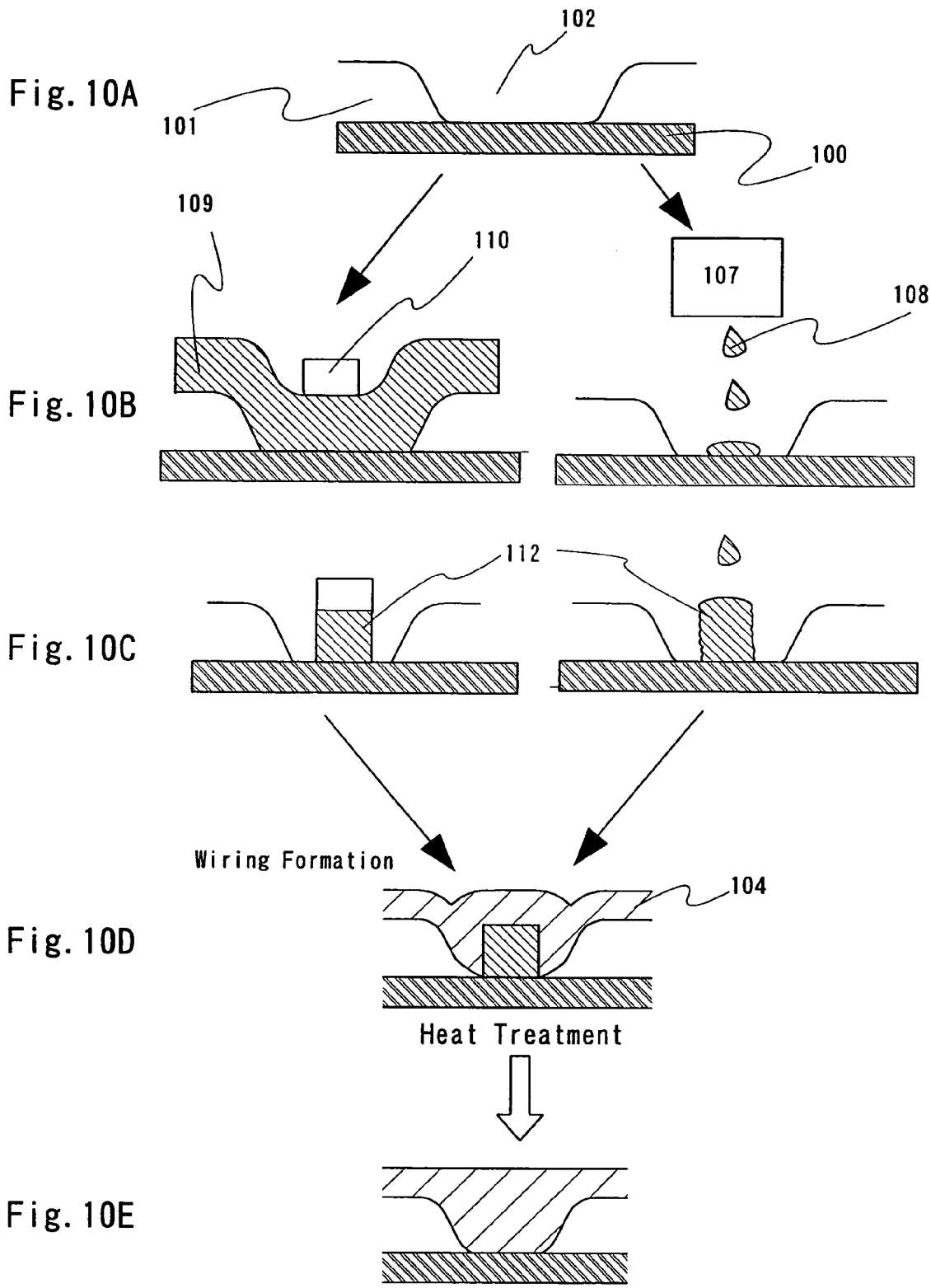
FIGS. 10A to 10E are figures in which a contact hole is planarized by using a columnar conductor

Then, pixel electrodes 901 and 902 made of a transparent conductor is formed over the entire surface so that they are electrically connected to the second conductive layers 820 and 822. For example, the pixel electrodes 901 and 902 can be made of a compound of indium oxide and tin oxide (ITO), a compound of indium oxide and zinc oxide, zinc oxide, tin oxide, indium oxide, titanium nitride, or the like. In this embodiment, ITO films are formed to a thickness of 0.1 µm by droplet discharging method as the pixel electrodes (FIG. 8A).

Figure 15B:
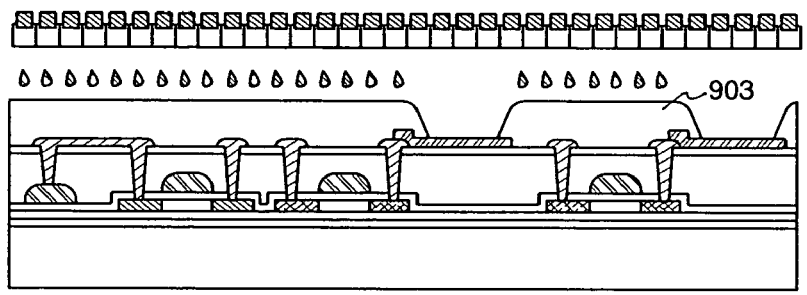
Figure 15C:
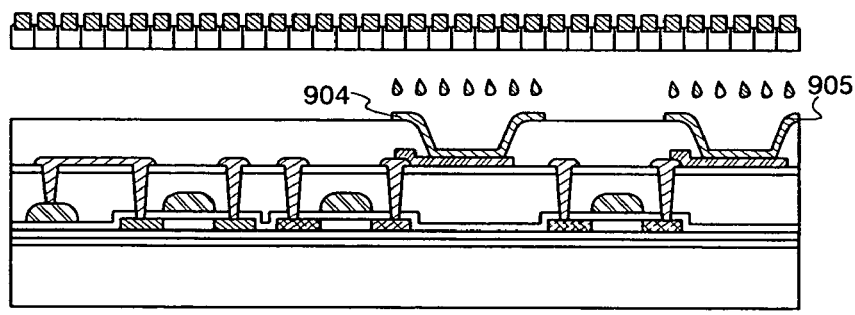
Figure 15D:
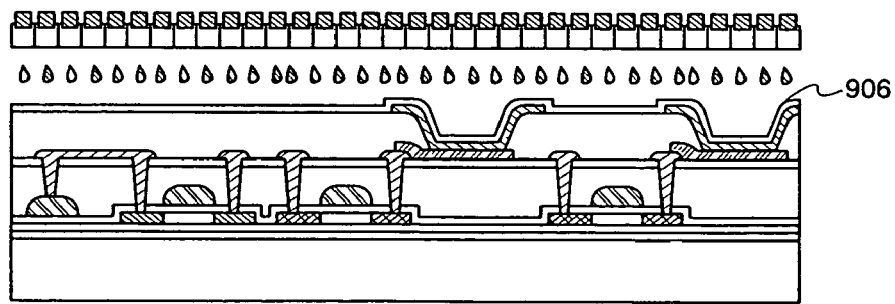

Thereafter, a light-emitting element of an organic EL is formed as follows. An insulating film 903 is formed to cover end faces of the pixel electrodes 901 and 902. The material for forming the insulating film 903 is not particularly limited, and can be formed from an inorganic material or an organic material. Subsequently, a region including an organic EL to be a light emitting layer is formed. Light emitting layers 904 and 905 are sequentially formed so as to be in contact with the pixel electrodes 901 and 902 under reduced pressure or in vacuum (FIGS. 15B and 15C). The material for the light emitting layers 904 and 905 is not limited particularly. However, in the case of a full-color display, respective materials for red, green, blue are used. In addition, an electrode 906 is formed by vapor deposition under reduced pressure or in vacuum (FIG. 15D).

The electrode 906 is formed with a stack of a thin film containing a metal having a small work function (such as lithium (Li), magnesium (Mg), or cesium (Cs)), and a transparent conductive film containing Li, Mg, etc, which is formed over a thin film. The film thickness of the electrode 906 may be set appropriately so that the electrode can serve as a cathode, preferably, to approximately from 0.01 µm to 1.0 µm in thickness. In this embodiment, an alloy film of aluminum and lithium (Al—Li) is formed to a thickness of 0.1 µm for the second pixel electrode. Note that, the electrode 906 is formed over the entire surface.

A metal film generally used for the cathode is a metal film containing an element belonging to Group 1 or 2 of the periodic table. Desirably, the surface of the metal film is protected since the metal film is easily oxidized. Further, since a thin metal film is required for the cathode, it is preferable to provide a conductive film with lower resistance supplementarily, thereby reducing the resistance of the cathode and protecting the cathode. A metal film containing aluminum, copper, or silver as its main component is used as the conductive film with lower resistance.

The formation of the light emitting layers 904 and 905 and the electrode 906 can be formed by changing the kinds of the composition discharged from the inkjet head 807, or changing the inkjet head 807 filled with the composition. In this case, such changes can be carried out without exposure to the atmospheric air, thereby improving the reliability of the light emitting element which is sensitive to moisture and the like.

The stack of the pixel electrodes 901 and 902, the light emitting layers 904 and 905, and the electrode 906, which is formed in the above-mentioned steps, corresponds to the light emitting element. The pixel electrodes 901 and 902 serve as anodes, whereas the electrode 906 serves as a cathode. Excited states of a light emitting element includes a singlet excited state and a triplet excited state; the light emitting element may emits light through any one of the excited states.

In this embodiment, a case of bottom emission in which light generated in the light emitting element passes through the substrate 801 side (the bottom side) is shown. However, top emission in which light is transmitted upward through the substrate 801 may be performed. In the case of the top emission, the pixel electrodes 901 and 902 are formed as the cathodes and the electrode 906 is formed as an anode. The electrode 906 may be formed of a transparent material. Further, a driving TFT is preferably formed of an n-channel TFT. Note that, the conductivity type of the driving TFT may be changed appropriately, on condition that a capacitor element is arranged so as to keep the gate-source voltage of the driving TFT.

A part of this embodiment corresponding to Embodiment Mode 1 can be replaced by the process described in Embodiment Modes 2 to 5. Further, normal photolithography technology may be mainly used for forming a semiconductor instead of droplet discharging method which is used to the maximum extent in this embodiment.

This embodiment can be appropriately combined with the embodiment modes and other embodiments.

Embodiment 3

In this embodiment, an example of applying the invention to a bottom gate TFT of a channel etch type, will be described with reference to FIGS. 16A to 16D.

Figure 16A:
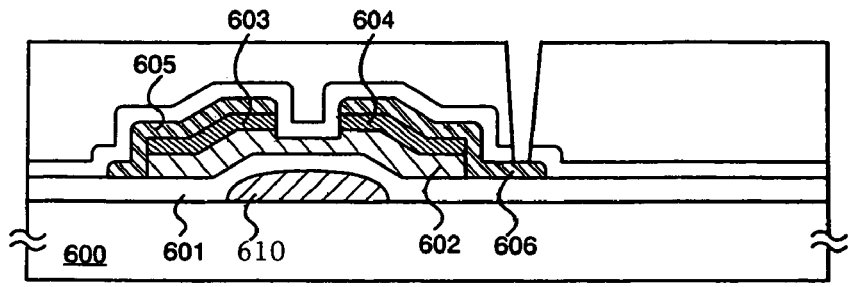
FIGS. 16A to 16D are figures which show an embodiment of the invention.

A gate electrode 610 is formed of Ta, Cr, Mo, Al or the like over a substrate 600. A gate insulating film 601 is formed of a silicon nitride film, a silicon oxide film, a tantalum oxide film, or the like over the substrate 600. A semiconductor film 602 having an amorphous structure is formed thereon so as to partially overlap with the gate electrode 610. The semiconductor film 602 having the amorphous structure is typically formed of amorphous silicon to a thickness of from 100 nm to 250 nm by plasma CVD. A semiconductor layer provided with n-type or p-type conductivity is formed so as to overlap the semiconductor film 602 having an amorphous structure. The semiconductor film 602 having an amorphous structure and the semiconductor layer are processed into island films, and then a film made of Cr, Ti, Ta, etc. is formed over the island semiconductor island films. The film is patterned so as to be source/drain electrodes 605 and 606. By using the source/drain electrodes 605 and 606 as masks, the semiconductor layer provided with the n-type or p-type conductivity is etched and divided into two regions 603 and 604. Since the foregoing etching process cannot be performed selectively, the semiconductor film 602 having the amorphous structure is also partially etched and removed. Thereafter, an insulating film is formed thereon, and a contact hole is formed so as to be connected to the source/drain electrodes 605 and 606 (FIG. 16A).

Figure 16B:
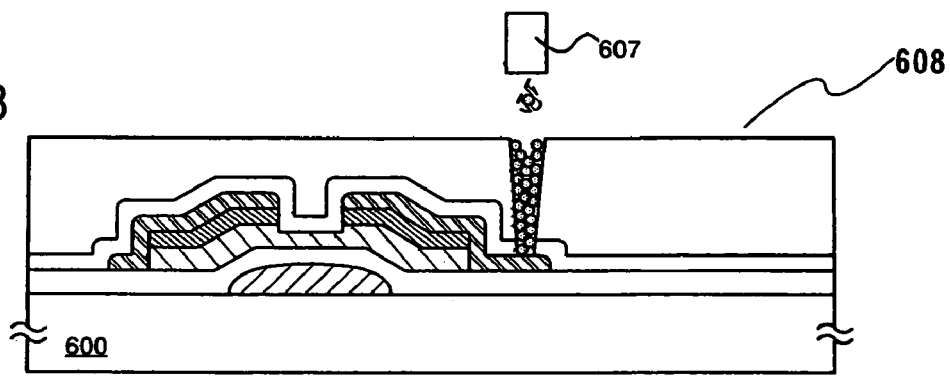
Figure 16C:
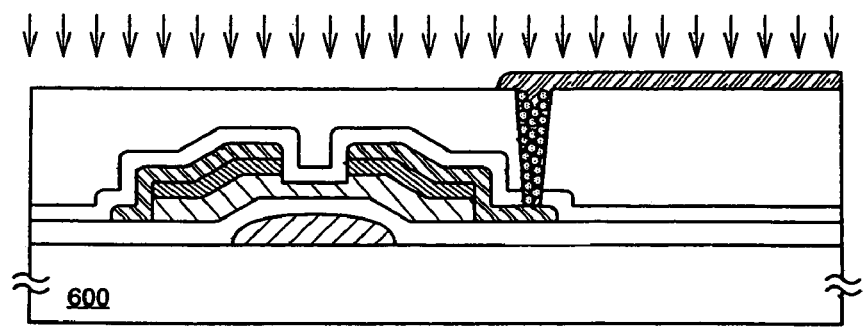
Figure 16D:
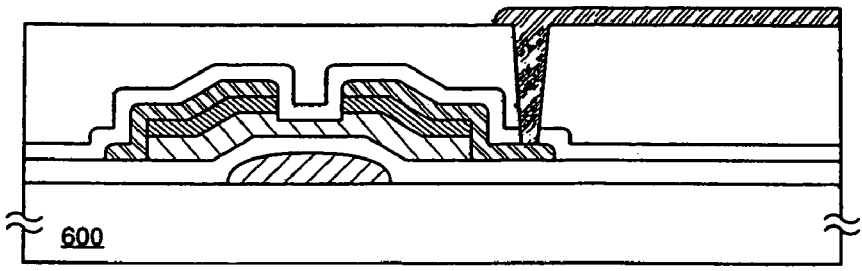

A wiring 608 is formed by droplet discharging method so as to be connected to the source/drain electrodes 605 and 606 through the contact hole. As a composition of a liquid droplet that is to be discharged from an inkjet nozzle 607, a solution in which fine particles of an alloy of silver and aluminum are dispersed in an organic solvent by using a dispersant is preferably used (FIG. 16B).

Since unevenness due to the contact hole is filled with conductive fine particles, the wiring 608 can be formed evenly to some extent and can be connected to the electrodes without performing reflow. Thus, the method is very effective in the case where simplification of steps is carried out in addition to planarization.

This embodiment can be appropriately combined with the embodiment modes and other embodiments.

Embodiment 4

Figure 17A:
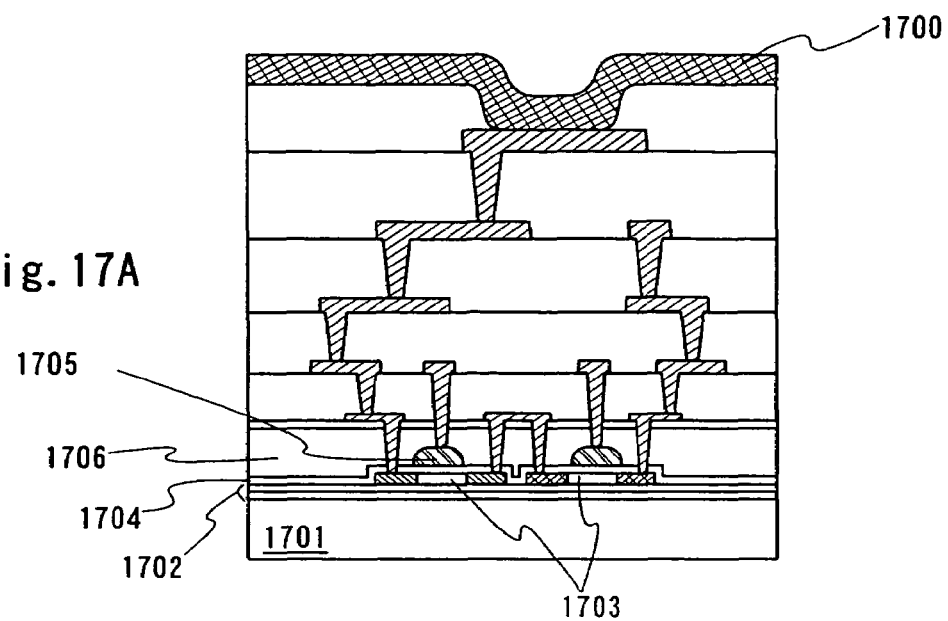
FIGS. 17A to 17C are figures which show an example of a multilevel interconnection.
Figure 17B:
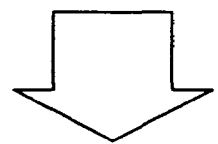
Figure 17B:
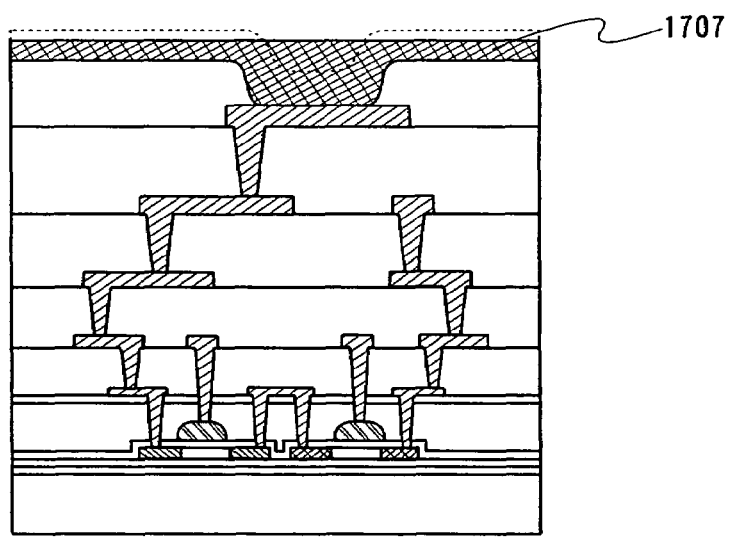
Figure 17C:
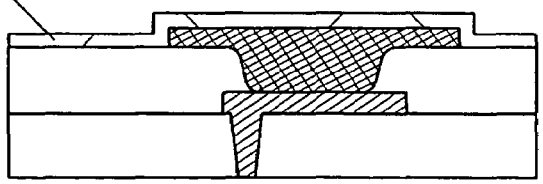

Another embodiment of the invention will be described with reference to FIG. 17A to FIG. 17C. FIG. 17A to FIG. 17C show an example of forming a multilevel interconnection which is advantageous to high integration as required for a CPU.

In this embodiment, only a wiring 1700 of the seventh layer, that is a top layer, of the multilevel interconnection, is formed by droplet discharging method, whereas the other wirings of the first layer to the sixth layer are formed by conventional photolithography using a photosensitive resist as a mask. In order to form the wirings with precision, films may be formed by sputtering and a wiring pattern may be formed by etching after a photolithography process in a conventional manner; and only a wiring pattern of upper layers of the multilevel interconnection, which have relatively more margin in the wiring patterns than the lower layers, may be formed by droplet discharging method. This embodiment shows an example in which only a top layer is formed by droplet discharging method, and a contact hole with large diameter is formed. Since the formation of a contact hole using the droplet discharging method does not require expensive materials such as a photo resist, which is very advantageous in reducing material costs.

FIGS. 17A to 17C show schematic views of cross section of only a part of an integrated circuit. Note the invention is not limited to this structure unless a structure of the integrated circuit deviates from the scope of the present invention. It is of course that the number of the laminated layers is not limited to this embodiment.

Semiconductor layers 1703 are formed over a substrate 1701 on which a base insulating film 1702 is formed. Gate electrodes 1705 are formed as the wirings of the first layer on a gate insulating film 1704, which is formed over the semiconductor layers 1703. An interlayer insulating film 1706 is made of a material such as silicon oxide, acrylic, or polyimide. The interlayer insulating film 1706 is etched by using a mask, which is formed by exposing and developing a photosensitive resist, and thus, contact holes are formed.

Subsequently, a wiring of the second layer is formed so as to be connected to impurity regions of the semiconductor layers. The wirings are usually formed of a material such as aluminum, titanium, an alloy of aluminum and titanium, or a stack thereof. In this embodiment, the wirings are made of an alloy of aluminum and germanium. Since the wiring is made of the alloy of aluminum and germanium, the surface of the wirings can be leveled by carrying out a reflow process.

After the formation of the wiring of the second layer, the wiring of the second layer is reflowed by instantaneously applying heat at a temperature of not less than the softening point of the wiring to the wiring of the second layer. Although specific heat temperature is changed according to the ratio of the alloy of aluminum and germanium used for the wiring; it is set at from about 250° C. to 400° C. By performing the reflow process, the surface of the wiring is preferably planarized, and contact defects can be repaired, thereby drastically improving the reliability.

Next, another interlayer insulating film is formed, and a wiring of the third layer is formed in the like manner as the wiring of the second layer. Preferably, the wiring of the third layer is also made of the alloy of aluminum and germanium, and the reflow process is performed.

Another interlayer insulating film is formed thereafter, and a wiring of the third layer is formed in the like manner as the second wiring. In order to planarize the contact hole with large diameter, the contact hole is filled with conductive fine particles by droplet discharging method. A solution in which fine particles of a Sn alloy are dispersed in an organic solvent by using a dispersant is used.

Subsequently, a conductive thin film is formed by sputtering or the like, and a wiring 1707 is formed by patterning and etching. The contact hole with large diameter is filled by droplet discharging method before the formation of the wiring; accordingly; the surface of the top layer is planarized in advance. If a reflow process is further performed at approximately 350° C., still higher reliability can be obtained.

Thus, a multilayer integrated circuit with good planarity and high reliability can be fabricated by alternate stacking and repeating reflow.

Further, after the wiring of the top layer is formed, it is preferable to form a silicon nitride film as a passivation film to cover the wiring; thus, the migration of the wiring can be avoided.

In recent years, a transfer technique has been studied as a method for forming elements on a plastic substrate or the like. When a multilevel interconnection, which is superior in surface flatness even in the wiring of the top layer, is fabricated according to the invention, the multilevel interconnection is expected to be applied to the transfer technique.

The transfer technique is a technique in which an element is normally formed on a glass substrate or the like, and thus formed element is adhered to a supporting body such that the element is separated from the glass substrate. At that time, if the surface of the element is not leveled, the element is not well-adhered to the supporting body, thereby causing defects in which the element is not properly separated from the glass substrate, for example. According to the invention, it can be expected that the flatness of the surface of the element be improved, and generation of such defects be suppressed.

What is claimed is:

1. A method for fabricating a semiconductor device comprising the steps of:
providing an opening in an insulating film so as to make a contact with a lower layer comprising a conductive material;
introducing conductive fine particles in the opening; and
introducing a conductive material at least in the opening and on the insulating film after introducing the conductive fine particles in the opening so as to form a wiring,
wherein the conductive fine particles are introduced in the opening by a droplet discharging method and the conductive material is introduced by sputtering.

2. A method according to claim 1, wherein the planarity of the surface of the wiring is improved by heat treatment after the wiring is formed.

3. A method according to claim 1, wherein the conductive fine particles are introduced in the opening by discharging a dispersion liquid containing the conductive fine particles using droplet discharging method.

4. A method according to claim 3,
wherein the dispersion liquid containing the conductive fine particles is applied to the insulating film provided with the opening by spin coating; and the dispersion liquid containing the conductive fine particles adhered to the area other than the opening is removed thereafter, thereby introducing the conductive fine particles in the opening.

5. A method according to claim 3,
wherein a substrate provided with the insulating film is immersed in the dispersion liquid containing the conductive fine particles and is pulled up; and
the dispersion liquid containing the conductive fine particles adhered to the area other than the opening is removed thereafter, thereby introducing the conductive fine particles in the opening.

6. A method according to claim 1,
wherein the conductive fine particles are scattered over the insulating film provided with the opening; and
the conductive fine particles adhered to the area other than the opening are removed thereafter, thereby introducing the conductive fine particles in the opening.

7. A method according to claim 1,
wherein ultrasonic vibration is applied after the conductive fine particles are scattered over the insulating film provided with the opening; and
the conductive fine particles adhered to the area other than the opening are removed thereafter, thereby introducing the conductive fine particles in the opening.

8. A method according to claim 1, wherein the semiconductor device is incorporated into a display device.

9. A method according to claim 1, wherein the conductive fine particles comprise a metal selected from the group consisting of Al, In, Sn, Pb, Ge, Ga, Zn, Cu, Ag, Au, Ti, Ni, Ta, and W or a compound thereof.

10. A method according to claim 1, wherein the conductive fine particles have high wettability with the conductive material.

11. A method for fabricating a semiconductor device comprising the steps of:
providing an opening in an insulating film so as to make a contact with a lower layer comprising a conductive material;
forming a columnar conductor in the opening with a gap between the columnar conductor and an inner side surface of the opening; and
forming a wiring at least in the opening and on the insulating film after forming the columnar conductor in the opening.

12. A method according to claim 11, wherein the planarity of the surface of the wiring is improved by heat treatment after the wiring is formed.

13. A method according to claim 11,
wherein the opening is formed in an insulating film so as to make a contact with a lower layer;
a conductive film is thereafter formed over the insulating film;
a mask is formed by patterning using photolithography; and
etching is performed, thereby forming the columnar conductor.

14. A method according to claim 11,
wherein the opening is formed in an insulating film so as to make a contact with a lower layer;
a conductive film is thereafter formed over the insulating film;
a mask is formed by discharging a material using droplet discharging method; and
etching is performed, thereby forming the columnar conductor.

15. A method according to claim 11, wherein the semiconductor device is incorporated into a display device.

16. A method according to claim 11, wherein the first material comprises a metal selected from the group consisting of Al, In, Sn, Pb, Ge, Ga, Zn, Cu, Ag, Au, Ti, Ni, Ta, and W or a compound or alloys thereof.

17. A method according to claim 11, wherein the columnar conductor has high wettability with the wiring.

18. A method according to claim 11, wherein the columnar conductor is formed by a droplet discharging method and the wiring is formed by sputtering.

19. A method for fabricating a semiconductor device comprising the steps of:
forming a conductive layer over a substrate;
forming an insulating film on the conductive film;
forming an opening in the insulating film;
introducing conductive fine particles in the opening; and
introducing a conductive material at least in the opening and on the insulating film after introducing the conductive fine particles in the opening so as to form a wiring,
wherein the conductive fine particles are introduced in the opening by a droplet discharging method and the conductive material is introduced by sputtering.

20. A method according to claim 19, wherein the planarity of the surface of the wiring is improved by heat treatment after the wiring is formed.

21. A method according to claim 19, wherein the conductive fine particles are introduced in the opening by discharging a dispersion liquid containing the conductive fine particles using droplet discharging method.

22. A method according to claim 21,
wherein the dispersion liquid containing the conductive fine particles is applied to the insulating film provided with the opening by spin coating; and
the dispersion liquid containing the conductive fine particles adhered to the area other than the opening is removed thereafter, thereby introducing the conductive fine particles in the opening.

23. A method according to claim 21,
wherein a substrate provided with the insulating film is immersed in the dispersion liquid containing the conductive fine particles and is pulled up; and
the dispersion liquid containing the conductive fine particles adhered to the area other than the opening is removed thereafter, thereby introducing the conductive fine particles in the opening.

24. A method according to claim 19,
wherein the conductive fine particles are scattered over the insulating film provided with the opening; and
the conductive fine particles adhered to the area other than the opening are removed thereafter, thereby introducing the conductive fine particles in the opening.

25. A method according to claim 19,
wherein ultrasonic vibration is applied after the conductive fine particles are scattered over the insulating film provided with the opening; and
the conductive fine particles adhered to the area other than the opening are removed thereafter, thereby introducing the conductive fine particles in the opening.

26. A method according to claim 19, wherein the semiconductor device is incorporated into a display device.

27. A method according to claim 19, wherein the conductive fine particles comprise a metal selected from the group consisting of Al, In, Sn, Pb, Ge, Ga, Zn, Cu, Ag, Au, Ti, Ni, Ta, and W or a compound thereof.

28. A method according to claim 19, wherein the conductive fine particles have high wettability with the conductive material.

29. A method for fabricating a semiconductor device comprising the steps of:
   forming an insulating film over a conductive layer;
   providing an opening in the insulating film;
   introducing conductive fine particles including a first material in the opening;
   forming a wiring including a second material over the insulating film to cover at least the opening after introducing the conductive fine particles in the opening; and
   heating the wiring to alloy the first material and the second material,
   wherein the wiring is electrically connected to the conductive layer.

30. A method according to claim 29, wherein the first material comprises a metal selected from the group consisting of Al, In, Sn, Pb, Ge, Ga, Zn, Cu, Ag, Au, Ti, Ni, Ta, and W or a compound thereof.

31. A method according to claim 29, wherein the conductive fine particles are introduced in the opening by a droplet discharging method and the wiring is formed by sputtering.

32. A method for fabricating a semiconductor device comprising the steps of:
   forming an insulating film over a conductive layer;
   providing an opening in the insulating film;
   introducing conductive fine particles in the opening; and
   forming a wiring over the insulating film to cover at least the opening after introducing the conductive fine particles in the opening so that the wiring is electrically connected with the conductive layer through the opening,
   wherein the wiring comprises a different metal from the conductive fine particles.

33. A method according to claim 32, wherein the conductive fine particles comprise a metal selected from the group consisting of Al, In, Sn, Pb, Ge, Ga, Zn, Cu, Ag, Au, Ti, Ni, Ta, and W and a compound thereof.

34. A method according to claim 32, wherein the conductive fine particles are introduced in the opening by a droplet discharging method and the wiring is formed by sputtering.

* * * * *